US 7,938,129 B2

(12) United States Patent
Hiroe et al.

(10) Patent No.: US 7,938,129 B2
(45) Date of Patent: May 10, 2011

(54) SUBSTRATE PROCESSING APPARATUS

(75) Inventors: Toshio Hiroe, Kyoto (JP); Hiroaki Uchida, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 1019 days.

(21) Appl. No.: 11/672,284

(22) Filed: Feb. 7, 2007

(65) Prior Publication Data
US 2007/0240743 A1    Oct. 18, 2007

(30) Foreign Application Priority Data

Feb. 7, 2006    (JP) ................. 2006-030171
May 18, 2006    (JP) ................. 2006-139268
Sep. 26, 2006   (JP) ................. 2006-260619

(51) Int. Cl.
B08B 3/00    (2006.01)

(52) U.S. Cl. ... 134/137; 134/94.1; 134/95.1; 134/104.2; 134/902

(58) Field of Classification Search ............ 134/50, 134/53, 54, 94.1, 95.1, 95.3, 98.1, 99.1, 99.2, 134/100.1, 103.2, 104.2, 902
See application file for complete search history.

(56) References Cited

U.S. PATENT DOCUMENTS

| | | | |
|---|---|---|---|
| 6,022,417 A | 2/2000 | Sumnitsch | |
| 6,203,218 B1 | 3/2001 | Omori et al. | |
| 6,247,479 B1* | 6/2001 | Taniyama et al. ........... | 134/95.2 |
| 6,523,572 B1 | 2/2003 | Levin et al. | |
| 6,644,703 B1 | 11/2003 | Levin et al. | |
| 2003/0034056 A1 | 2/2003 | Amai et al. | |
| 2003/0178134 A1 | 9/2003 | Muramoto et al. | |
| 2003/0226577 A1* | 12/2003 | Orll et al. ............... | 134/1.3 |
| 2004/0031503 A1* | 2/2004 | Eitoku ............... | 134/2 |
| 2004/0106072 A1 | 6/2004 | Itoh et al. | |
| 2004/0216841 A1 | 11/2004 | Ito et al. | |
| 2004/0261817 A1* | 12/2004 | Araki et al. ............... | 134/2 |
| 2005/0079639 A1 | 4/2005 | Itoh et al. | |
| 2005/0081996 A1 | 4/2005 | Itoh et al. | |
| 2005/0106511 A1 | 5/2005 | Itoh et al. | |
| 2005/0126605 A1 | 6/2005 | Yassour et al. | |
| 2006/0045652 A1 | 3/2006 | Miya | |
| 2007/0221253 A1 | 9/2007 | Nishikido | |

FOREIGN PATENT DOCUMENTS

| | | |
|---|---|---|
| JP | 8-186079 | 7/1996 |
| JP | 2001-68449 | 3/2001 |
| JP | 2004-363200 | 12/2004 |

(Continued)

OTHER PUBLICATIONS

Machine Translation of JP 2001-68449 to Fukuzawa, Mar. 2001.*
Office Action issued on Jan. 9, 2009 in connection with corresponding Chinese Patent Application No. 200710006225.8.
Korean Office Action issued Feb. 29, 2008 in connection with the corresponding Korean Application No. 10-2007-0012474.

(Continued)

*Primary Examiner* — Michael Barr
*Assistant Examiner* — Benjamin Osterhout
(74) *Attorney, Agent, or Firm* — Ostrolenk Faber LLP

(57) ABSTRACT

A substrate processing apparatus of the present invention is to apply processing using a processing liquid to a substrate. The substrate processing apparatus includes a first-side plate disposed oppositely to a first surface of the substrate with a distance and provided with plural discharge ports and suction ports in a surface opposing the first surface, a first-side processing liquid supply mechanism that supplies a processing liquid to the discharge ports in the first-side plate, and a first-side suction mechanism that sucks insides of the suction ports in the first-side plate.

40 Claims, 11 Drawing Sheets

FOREIGN PATENT DOCUMENTS

| | | |
|---|---|---|
| JP | 2005-15913 | 1/2005 |
| JP | 2005-340661 | 12/2005 |
| JP | 2006-19545 | 1/2006 |
| KR | 2000-0012105 | 2/2000 |
| KR | 2003-0076267 | 9/2003 |
| TW | 402767 | 8/2000 |
| TW | 554401 | 9/2003 |
| TW | 564474 | 12/2003 |
| TW | 243407 | 11/2005 |
| WO | WO 03/061354 | 7/2003 |

OTHER PUBLICATIONS

Korean Office Action (Notice of Allowance) issued on Aug. 28, 2008 in connection with corresponding Korean Application No. 10-2007-0012474. KR2000-0012105 was previously submitted in an IDS filed Apr. 1, 2008 and is therefore not enclosed.

Taiwan Office Action issued Apr. 9, 2010 in connection with corresponding Taiwanese Patent Application No. 096104389.

* cited by examiner

SUBSTRATE PROCESSING APPARATUS

BACKGROUND OF THE INVENTION

1. Field of the Invention

The present invention relates to a substrate processing apparatus that applies processing using a processing liquid to various kinds of substrates represented by a semiconductor wafer, a glass substrate for liquid crystal display, a glass substrate for plasma display, a glass substrate for FED (Field Emission Display), an optical disc substrate, a magnetic disc substrate, a magneto optical disc substrate, a photomask substrate, and so forth.

2. Description of Related Art

In the fabrication sequence of a semiconductor device and a liquid crystal display, processing to clean the surface of a substrate, such as a semiconductor wafer and a glass substrate for liquid crystal display panel, using a processing liquid is performed by supplying the processing liquid to the surface of the substrate.

For example, an apparatus of a single substrate processing type that applies cleaning processing to substrates one by one includes a spin chuck that rotates a substrate while holding the substrate almost in a horizontal posture and a nozzle that supplies a processing liquid to the surface of the substrate being rotated by the spin chuck. During the processing, a processing liquid is supplied from the nozzle to the surface of the substrate at near the center of rotation while the substrate is rotated by the spin chuck. The processing liquid supplied onto the surface of the substrate experiences a centrifugal force induced by rotation of the substrate and flows over the surface of the substrate toward the outer edge thereof. The processing liquid is thus distributed across the entire surface of the substrate and rinse processing for the surface of the substrate using the processing liquid is achieved.

As a typical spin chuck, a spin chuck of a vacuum contact type that holds the substrate by means of vacuum contact to the bottom surface (the surface faced down) of the substrate and a spin chuck of an edge face pinching type that holds the substrate by pinching the edge face of the substrate with plural chuck pins are known. However, the spin chucks of both the vacuum contact type and the edge face pinching type cannot help coming into contact with the substrate, and a trace of contact may possibly be left on the substrate.

As a result, attention is recently attracted to a spin chuck of a non-contact type that has a substrate-opposing surface disposed oppositely to the bottom surface of the substrate with a microscopic distance, and supports the substrate by exploiting the Bernoulli effect produced by supplying a nitrogen gas from the substrate-opposing surface to a space between the substrate-opposing surface and the bottom surface of the substrate. Because the spin chuck of the non-contact type is able to support the substrate without coming into contact with the substrate, there is no risk of leaving a trace of contact on the substrate.

When the spin chuck of the non-contact type is adopted, however, the surface of the substrate subject to processing is limited to the top surface (the surface faced up). More specifically, it is only possible to process the top surface of the substrate by supplying the processing liquid to the top surface of the substrate, and because the processing liquid cannot be supplied to the bottom surface of the substrate at the same time, it is impossible to process both the top surface and the bottom surface of the substrate concurrently. Hence, when the both surfaces need to be processed, after one surface of the substrate is processed, the substrate has to be inverted vertically to apply the processing to the other surface. This extends a time needed to process a single substrate.

SUMMARY OF THE INVENTION

An object of the invention is to provide a substrate processing apparatus that holds the surface of the substrate subject to processing in a non-contact state and yet is capable of applying processing with a processing liquid to the surface subject to processing.

In order to achieve the object, a substrate processing apparatus according to one aspect of the present invention is a substrate processing apparatus that applies processing using a processing liquid to a substrate. The substrate processing apparatus includes: a first-side plate disposed oppositely to a first surface of the substrate with a distance and provided with plural discharge ports and suction ports in a surface opposing the first surface; a first-side processing liquid supply mechanism that supplies a processing liquid to the discharge ports in the first-side plate; and a first-side suction mechanism that sucks insides of the suction ports in the first-side plate.

According to this configuration, the first-side plate is disposed oppositely to the first surface of the substrate, and the processing liquid is discharged toward the first surface of the substrate from the discharge ports made in the first-side plate while the processing liquid is sucked through the suction ports made in the first-side plate. A flow of the processing liquid is then produced in a space between the first-side plate and the first surface of the substrate. This flow of the processing liquid enables holding by attraction in a non-contact state in which the first surface of the substrate is spaced apart from the first-side plate by a specific distance. At this time, the first surface of the substrate is wetted by the processing liquid, and the processing with the processing liquid is thus applied to the first surface of the substrate. Hence, the first surface of the substrate, which is the surface subject to processing, can be held in a non-contact state, and yet it is still possible to apply the processing with the processing liquid to the first surface of the substrate. In addition, by supplying the processing liquid to a second-surface of the substrate on the opposite side of the first surface in this state, it is possible to apply the processing with the processing liquid also to the second surface of the substrate, which makes it possible to achieve the processing on the both surfaces of the substrate concurrently.

The first-side processing liquid supply mechanism may supply the discharge ports in the first-side plate with a chemical liquid as the processing liquid.

According to this configuration, because the chemical liquid is supplied to the discharge ports by the first-side processing liquid supply mechanism and the chemical liquid is discharged from the discharge ports, it is possible to apply the processing with the chemical liquid to the first surface of the substrate.

In this configuration, it is preferable to further include a first-side pure water supply mechanism that supplies pure water to the discharge ports in the first-side plate.

According to this configuration, by supplying pure water to the discharge ports by the first-side pure water supply mechanism and discharging the pure water from the discharge ports after the processing with the chemical liquid, it is possible to rinse away the chemical liquid adhering onto the first surface of the substrate with the pure water.

In the configuration including the first-side pure water supply mechanism, the discharge ports to which the pure water is supplied by the first-side pure water supply mechanism may be common with the discharge ports to which the processing liquid is supplied by the first-side processing liquid supply mechanism.

According to this configuration, because the discharge ports for discharging the processing liquid and the discharge ports for discharging the pure water are common, a total number of the discharge ports made in the first-side plate is small in comparison with the configuration in which the discharge ports for discharging the processing liquid and the discharge ports for discharging the pure water are different. Consequently, the configuration of the first-side plate can be simpler.

Meanwhile, in the configuration including the first-side pure water supply mechanism, the discharge ports to which the pure water is supplied by the first-side pure water supply mechanism may be different from the discharge ports to which the processing liquid is supplied by the first-side processing liquid supply mechanism.

According to this configuration, because the discharge ports for discharging the processing liquid and the discharge ports for discharging the pure water are different, it is possible to prevent the processing liquid and the pure water from mixing at the discharge ports. The highly-pure processing liquid and pure water can be therefore supplied to the first surface of the substrate. It is thus possible to apply the processing with the processing liquid and the processing with the pure water to the first surface of the substrate in a satisfactory manner.

The first-side processing liquid supply mechanism may supply the discharge ports in the first-side plate with pure water as the processing liquid.

According to this configuration, because pure water is supplied to the discharge ports by the first-side processing liquid supply mechanism and the pure water is discharged from the discharge ports, it is possible to apply the processing with the pure water to the first surface of the substrate.

It is preferable that the substrate processing apparatus further includes a first-side drying accelerator fluid supply mechanism that supplies the discharge ports in the first-side plate with a drying accelerator fluid that accelerates drying of the substrate.

According to this configuration, for example, by supplying the drying accelerator fluid to the discharge ports by the first-side drying accelerator fluid supply mechanism and discharging the drying accelerator fluid from the discharge ports after the processing with the pure water (after the chemical liquid adhering onto the first surface of the substrate is rinsed away with the pure water), it is possible to accelerate the drying of the pure water adhering onto the first surface of the substrate. A time needed for the processing to dry the substrate can be therefore shortened.

In the configuration including the first-side drying accelerator fluid supply mechanism, the discharge ports to which the drying accelerator fluid is supplied by the first-side drying accelerator fluid supply mechanism may be common with the discharge ports to which the processing liquid is supplied by the first-side processing liquid supply mechanism.

According to this configuration, because the discharge ports for discharging the processing liquid and the discharge ports for discharging the drying accelerator fluid are common, a total number of the discharge ports made in the first-side plate is small in comparison with the configuration in which the discharge ports for discharging the processing liquid and the discharge ports for discharging the drying acceleration fluid are different. Consequently, the configuration of the first-side plate can be simpler.

Meanwhile, in the configuration including the first-side drying accelerator fluid supply mechanism, the discharge ports to which the drying accelerator fluid is supplied by the first-side drying accelerator fluid supply mechanism may be different from the discharge ports to which the processing liquid is supplied by the first-side processing liquid supply mechanism.

According to this configuration, because the discharge ports for discharging the processing liquid and the discharge ports for discharging the drying accelerator fluid are different, it is possible to prevent the processing liquid and the drying accelerator fluid from mixing at the discharge ports. The highly-pure processing liquid and drying accelerator fluid can be therefore supplied to the first surface of the substrate.

It is preferable that the substrate processing apparatus further includes a first-side gas supply mechanism that supplies an inert gas to the discharge ports in the first-side plate.

According to this configuration, by supplying an inert gas to the discharge ports by the first-side gas supply mechanism and discharging the inert gas from the discharge ports after the drying accelerator fluid is supplied to the first surface of the substrate, it is possible to dry the first surface of the substrate quickly without leaving a water mark (a trace of drying) on the first surface of the substrate.

In the configuration including the first-side gas supply mechanism, the discharge ports to which the inert gas is supplied by the first-side gas supply mechanism may be common with the discharge ports to which the processing liquid is supplied by the first-side processing liquid supply mechanism.

According to this configuration, because the discharge ports for discharging the processing liquid and the discharge ports for discharging the inert gas are common, a total number of the discharge ports made in the first-side plate is small in comparison with the configuration in which the discharge ports for discharging the processing liquid and the discharge ports for discharging the inert gas are different. Consequently, the configuration of the first-side plate can be simpler.

Meanwhile, in the configuration including the first-side gas supply mechanism, the discharge ports to which the inert gas is supplied by the first-side gas supply mechanism may be different from the discharge ports to which the processing liquid is supplied by the first-side processing liquid supply mechanism.

According to this configuration, because the discharge ports for discharging the processing liquid and the discharge ports for discharging the inert gas are different, it is possible to prevent the processing liquid remaining at the discharge ports from being discharged together with the inert gas when the inert gas is discharged. It is thus possible to prevent contamination on the first surface of the substrate by the processing liquid.

It is preferable that the substrate processing apparatus further includes a first-side flow rate control mechanism that controls a flow rate of the processing liquid supplied to the discharge ports by the first-side processing liquid supply mechanism.

According to this configuration, by controlling a flow rate of the processing liquid supplied to the discharge ports in the first-side plate to control a flow rate of the processing liquid supplied to the first surface of the substrate from the discharge ports, it is possible to adjust a rate of progress in the processing on the first surface of the substrate. For example, in a case where the processing liquid is an etching liquid to etch away the thin film on the first surface of the substrate, it is possible to adjust the etching rate by controlling a supply flow rate of the etching liquid.

It is preferable that the substrate processing apparatus further includes: a second-side plate disposed oppositely to a second surface of the substrate on an opposite side of the first surface with a distance and provided with plural discharge ports and suction ports in a surface thereof opposing the second surface; a second-side processing liquid supply mechanism that supplies the processing liquid to the discharge ports in the second-side plate; and a second-side suction mechanism that sucks insides of the suction ports in the second-side plate.

According to this configuration, the second-side plate is disposed oppositely to the second surface of the substrate on the opposite side of the first surface, and the processing liquid is discharged toward the second surface of the substrate from the discharge ports made in the second-side plate while the processing liquid is sucked through the suction ports made in the second-side plate. A flow of the processing liquid is then produced in a space between the second-side plate and the second surface of the substrate. This flow of the processing liquid enables holding by attraction in a non-contact state in which the second surface of the substrate is spaced apart from the second-side plate by a specific distance. More specifically, the substrate is held by attraction in a non-contact state in which it is spaced apart from the first-side plate by a specific distance while at the same time the substrate is held by attraction in a non-contact state in which it is also spaced apart from the second-side plate by a specific distance. At this time, both the first surface and the second surface of the substrate are wetted by the processing liquid, and the processing with the processing liquid is thus applied to the both surfaces of the substrate. Hence, the substrate can be held in a non-contact state, and yet it is still possible to achieve the processing on the both surfaces of the substrate concurrently.

It is preferable that the substrate processing apparatus further includes a second-side flow rate control mechanism that controls a flow rate of the processing liquid supplied to the discharge ports by the second-side processing liquid supply mechanism.

According to this configuration, by controlling a flow rate of the processing liquid supplied to the discharge ports in the second-side plate to control a flow rate of the processing liquid supplied to the second surface of the substrate from the discharge ports, it is possible to adjust a rate of progress in the processing on the second surface of the substrate. For example, in a case where the processing liquid is an etching liquid to etch away the thin film on the second surface of the substrate, it is possible to adjust the etching rate by controlling a supply flow rate of the etching liquid.

It should be noted that a second-side gas supply mechanism that supplies an inert gas to the discharge ports in the second-side plate may be provided instead of the second-side processing liquid supply mechanism.

According to this configuration, the second-side plate is disposed oppositely to the second surface of the substrate on the opposite side of the first surface, and an inert gas is discharged toward the second surface of the substrate from the discharge ports made in the second-side plate while the inert gas is sucked through the suction ports made in the second-side plate. A flow of the inert gas is then produced in a space between the second-side plate and the second surface of the substrate. This flow of the inert gas enables holding by attraction in a non-contact state in which the second surface of the substrate is spaced apart from the second-side plate by a specific distance. More specifically, the substrate is held by attraction in a non-contact state in which it is spaced apart from the first-side plate by a specific distance while at the same time it is held by attraction in a non-contact state in which it is also spaced apart from the second-side plate by a specific distance. At this time, the processing liquid supplied to the first surface of the substrate is not allowed to go into a space between the second surface of the substrate and the second-side plate because of the flow of the inert gas produced in this space. It is thus possible to apply the processing with the processing liquid to the first surface of the substrate while protecting the second surface of the substrate.

When the second-side gas supply mechanism is provided in addition to the second-side processing liquid supply mechanism, it is possible to apply the processing with the processing liquid to the first surface of the substrate while protecting the second surface of the substrate by supplying an inert gas to the discharge ports. In addition, by supplying the processing liquid to the discharge ports, it is possible to apply the processing with the processing liquid to both the first surface and the second surface of the substrate concurrently.

The second-side plate may serve also as a substrate carrier mechanism that carries the substrate to a substrate processing position opposing the first-side plate.

According to this configuration, because the second-side plate serves also as the substrate carrier mechanism, the configuration can be simpler and the cost can be saved in comparison with a case where the substrate carrier mechanism is provided separately.

It is preferable that the substrate processing apparatus further includes a separation and approximation mechanism that allows the first-side plate and the second-side plate to come closer and move apart relatively to each other.

According to this configuration, it is possible to allow the first-side plate and the second-side plate to come closer and move apart with respect to each other by the separation and approximation mechanism. Hence, by allowing the first-side plate and the second-side plate to move apart when the substrate is carried in and out, it is possible to carry in and out the substrate smoothly.

It is preferable that the substrate processing apparatus further includes a sealing mechanism that seals a space between an outer edge portion of the first-side plate and an outer edge portion of the second-side plate.

According to this configuration, by sealing a space between the outer edge portion of the first-side plate and the outer edge portion of the second-side plate, it is possible to make the surrounding of the substrate held by attraction by the first-side plate and the second-side plate into a hermetically sealed space. It is thus possible to perform the processing with the processing liquid while preventing ambient air containing the processing liquid from being diffused into the surrounding.

The second-side plate may be provided with channels connected to the discharge ports, and connection portions of the channels to the discharge ports may have tapered cross sections that widen toward the discharge ports.

According to this configuration, because the connection portions of the channels to the discharge ports are made to have the tapered cross sections that widen toward the discharge ports, it is possible to disperse a pressure (discharge pressure) of the processing liquid or the inert gas discharged from the discharge ports in a direction parallel to the second surface of the substrate. The processing liquid or the inert gas can be therefore supplied uniformly to the second surface of the substrate.

The second-side plate may be provided with channels connected to the discharge ports, and the substrate processing apparatus may further include discharge pressure dispersing balls provided in connection portions of the channels to the discharge ports.

According to this configuration, because the discharge pressure dispersing balls are provided in the connection portions of the channels to the discharge ports, it is possible to disperse a pressure (discharge pressure) of the processing liquid or the inert gas discharged from the discharge ports in a direction parallel to the second surface of the substrate. The processing liquid or the inert gas can be therefore supplied uniformly to the second surface of the substrate.

It is preferable that the substrate processing apparatus further includes a second-side rotation driving mechanism that is coupled to the second-side plate and rotates the second-side plate about an axis line orthogonal to the surface of the second-side plate opposing the second surface of the substrate.

According to this configuration, it is possible to rotate the second-side plate about the axis line orthogonal to the surface of the second-side plate opposing the second surface of the substrate. The positions on the second surface of the substrate opposing the respective discharge ports in the second-side plate can be changed by rotating the second-side plate while the substrate is held by the first-side plate. It is thus possible to prevent the processing liquid or the like from being supplied locally to the second surface of the substrate with a strong force. Consequently, processing such as the processing with the processing liquid can be applied uniformly to the second surface of the substrate.

In the configuration including the second-side rotation driving mechanism, it is preferable to further include a first-side rotation driving mechanism that is coupled to the first-side plate and rotates the first-side plate about an axis line orthogonal to the surface of the first-side plate opposing the first surface of the substrate.

According to this configuration, it is possible to rotate not only the second-side plate, but also the first-side plate about the axis line orthogonal to the surface of the first-side plate opposing the first surface of the substrate. The positions on the second surface of the substrate opposing the respective discharge ports in the second-side plate and the positions on the first surface of the substrate opposing the respective discharge ports in the first-side plate can be changed by rotating both the first-side plate and the second-side plate. It is thus possible to prevent the processing liquid or the like from being supplied locally to both the first surface and the second surface of the substrate with a strong force. Consequently, the processing with the processing liquid can be applied uniformly to both the first surface and the second surface of the substrate.

The first-side plate may be provided with channels connected to the discharge ports, and connected portions of the channels to the discharge ports may have tapered cross sections that widen toward the discharge ports.

According to this configuration, because the connection portions of the channels to the discharge ports have the tapered cross sections that widen toward the discharge ports, it is possible to disperse a pressure (discharge pressure) of the processing liquid, the pure water, the drying accelerator fluid, or the inert gas discharged from the discharge ports in a direction parallel to the first surface of the substrate. It is thus possible to supply the processing liquid, the pure water, the drying accelerator fluid, or the inert gas uniformly to the first surface of the substrate.

The first-side plate may be provided with channels connected to the discharge ports, and the substrate processing apparatus may further include discharge pressure dispersing balls provided in connection portions of the channels to the discharge ports.

According to this configuration, because the discharge pressure dispersing balls are provided in the connection portions of the channels to the discharge ports, it is possible to disperse a pressure (discharge pressure) of the processing liquid, the pure water, the drying accelerator fluid, or the inert gas discharged from the discharge ports in a direction parallel to the first surface of the substrate. It is thus possible to supply the processing liquid, the pure water, the drying accelerator fluid, or the inert gas uniformly to the first surface of the substrate.

The substrate may have on the first surface a device forming region in which devices are formed.

According to this configuration, it is possible to apply the processing with the processing liquid discharged from the discharge ports in the first-side plate to the surface of the substrate on the device forming region side.

The substrate may have on the second surface a device forming region in which devices are formed.

According to this configuration, it is possible to apply the processing with the processing liquid discharged from the discharge ports in the first-side plate to a surface of the substrate on the opposite side of the front surface on the device forming region side, that is, the back surface of the substrate.

The device forming region may be formed only on the first surface or it may be formed only on the second surface of the substrate. Alternatively, the device forming region may be formed on both the first surface and the second surface of the substrate. In this case, by providing the second-side plate, it is possible to perform the processing with the processing liquid concurrently to the both device forming regions formed on the first and second surfaces of the substrate.

It is preferable that the substrate processing apparatus further includes a processing liquid reusing mechanism that allows the processing liquid sucked through the suction ports in the first-side plate to be reused for processing a substrate by returning the processing liquid to supply channels of the processing liquid of the first-side processing liquid supply mechanism.

According to this configuration, the processing liquid sucked through the suction ports in the first-side plate can be reused for the processing to a substrate performed thereafter. It is thus possible to prevent wasting of the processing liquid, which can in turn reduce a quantity of the consumed processing liquid.

It is preferable that the substrate processing apparatus further includes a substrate rotating mechanism that rotates the substrate on the first-side plate.

According to this configuration, by allowing the substrate to rotate (including revolution and rotation on its axis) on the first-side plate, it is possible to supply the processing liquid to the first surface (and the second surface) of the substrate uniformly without any irregularity. The uniformity of the processing can be therefore enhanced.

It is preferable that the substrate processing apparatus further includes a substrate position moving mechanism that moves the position of the substrate on the first-side plate.

According to this configuration, by moving the position of the substrate on the first-side plate, it is possible to supply the processing liquid to the first surface (and the second surface) of the substrate more uniformly. The uniformity of the processing can be therefore enhanced further.

The above and other objects, features, and effects of the present invention will become more apparent from the following description of embodiments with reference to the accompanying drawings.

DETAILED DESCRIPTION OF PREFERRED EMBODIMENTS

Hereinafter, embodiments of the invention will be described in detail with reference to the accompanying drawings.

Figure 1:
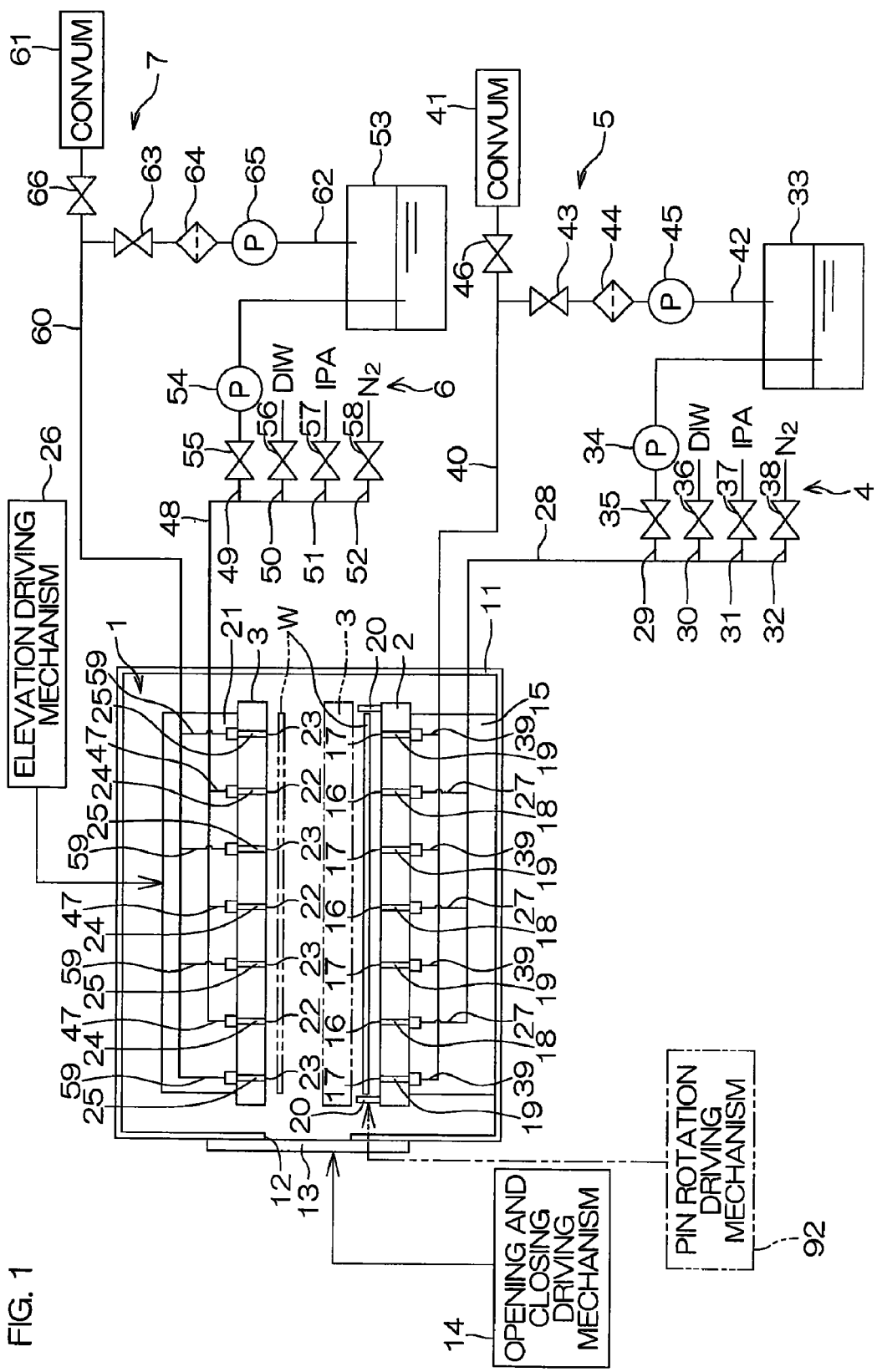
FIG. 1 is a cross sectional view schematically showing the configuration of a substrate processing apparatus according to one embodiment of the invention.

FIG. 1 is a cross sectional view schematically showing the configuration of a substrate processing apparatus according to one embodiment of the invention.

This substrate processing apparatus is of a single wafer processing type that applies processing using a processing liquid to both the front surface on a device forming region side and the back surface of a semiconductor wafer (hereinafter, referred to simply as the wafer) W as an example of the substrate. The substrate processing apparatus includes a processing chamber 1, a bottom plate 2 and a top plate 3 disposed in the interior of the processing chamber 1, a lower supply mechanism 4 and a lower suction mechanism 5 connected to the bottom plate 2, and an upper supply mechanism 6 and an upper suction mechanism 7 connected to the top plate 3.

The processing chamber 1 is defined by a partition wall 11, and an opening 12 for carrying in and out the wafer W is formed in one side wall. In connection with the opening 12, a shutter 13 that opens and closes the opening 12 is provided. An opening and closing driving mechanism 14 including a driving source, such as a cylinder, is coupled to the shutter 13. The shutter 13 opens the opening 12 as it is moved by the opening and closing mechanism 14, for example, to an opening position at a lower position while moving apart laterally from the outside surface of the one side wall provided with the opening 12. Further, the shutter 13 closes the opening 12 as it is moved by the opening and closing mechanism 14 to an upper position from the opening position while coming closer to the one side wall.

The bottom plate 2 is formed in the shape of a circular plate having a diameter larger than that of the wafer W. The bottom plate 2 is fixed to a plate support stand 15 provided to the bottom surface of the processing chamber 1 and disposed along the horizontal surface at a position lower than the lower edge of the opening 12. Plural discharge ports 16 and suction ports 17 are made in the top surface of the bottom plate 2. Further, the bottom plate 2 is provided with supply channels 18 generally in the shape of a circular column that communicate with the respective discharge ports 16 and suction channels 19 generally in the shape of a circular column that communicate with the respective suction ports 17, each of which penetrates through the bottom plate 2 in the thickness direction (top-bottom direction). Further, plural (for example, four) guide pins 20 to guide the edge face of the wafer W are provided to stand on the top surface of the bottom plate 2.

The top plate 3 is formed in the shape of a circular plate having a diameter larger than that of the wafer W. The top plate 3 is fixed to the bottom surface of a support block 21 supported on an unillustrated arm and disposed above the bottom plate 2 oppositely to the bottom plate 2 in a parallel posture. Plural discharge ports 22 and suction ports 23 are made in the bottom surface of the top plate 3. Further, the top plate 3 is provided with supply channels 24 generally in the shape of a circular column that communicate with the respective discharge ports 22 and suction channels 25 generally in the shape of a circular column that communicate with the respective suction ports 23, each of which penetrates through the top plate 3 in the thickness direction (top-bottom direction). Further, an elevation driving mechanism 26 serving as a separation and approximation mechanism that moves up and down the top plate 3 is coupled to the top plate 3.

The lower supply mechanism 4 is configured to be able to selectively supply hydrofluoric acid (HF) as a processing liquid, DIW (de-ionized pure water), IPA (isopropyl alcohol), and a nitrogen gas to the discharge ports 16 via the supply channels 18 in the bottom plate 2.

More specifically, the lower supply mechanism 4 includes branch connection tubes 27 connected to the respective supply channels 18 at one end, and a collecting supply tube 28 to which the other ends of the branch connection tubes 27 are connected commonly. The collecting supply tube 28 extends to the outside of the processing chamber 1. On the outside of the processing chamber 1, a processing liquid supply tube 29, a DIW supply tube 30, an IPA supply tube 31, and a nitrogen gas supply tube 32 are connected to the collecting supply tube 28. The processing liquid supply tube 29 extends from a processing liquid tank 33 storing the processing liquid. A processing liquid pump 34 that pumps up hydrofluoric acid out of the processing liquid tank 33 and a processing liquid valve 35 that opens and closes the processing liquid supply tube 29 are interposed somewhere in the middle of the processing liquid supply tube 29. DIW from an unillustrated DIW supply source is supplied to the DIW supply tube 30. A DIW valve 36 that opens and closes the DIW supply tube 30 is interposed somewhere in the middle of the DIW supply tube 30. IPA from an unillustrated IPA supply source is supplied to the IPA supply tube 31. An IPA valve 37 that opens and closes the IPA supply tube 31 is interposed somewhere in the middle of the IPA supply tube 31. A nitrogen gas from an unillustrated nitrogen gas supply source is supplied to the nitrogen gas supply tube 32. A nitrogen gas valve 38 that opens and closes the nitrogen gas supply tube 32 is interposed somewhere in the middle of the nitrogen gas supply tube 32.

According to the configuration as above, by closing the DIW valve 36, the IPA valve 37, and the nitrogen gas valve 38 and opening the processing liquid valve 35 and by driving the processing liquid pump 34, it is possible to supply hydrofluoric acid stored in the processing liquid tank 33 to the respective discharge ports 16. Further, by closing the processing liquid valve 35, the IPA valve 37, and the nitrogen gas valve 38 and opening the DIW valve 36, it is possible to supply DIW from the DIW supply source to the respective discharge ports 16. Further, by closing the processing liquid valve 35, the DIW valve 36, and the nitrogen gas valve 38 and opening the IPA valve 37, it is possible to supply IPA from the IPA supply source to the respective discharge ports 16. Furthermore, by closing the processing liquid valve 35, the DIW valve 36, and the IPA valve 37 and opening the nitrogen gas valve 38, it is possible to supply a nitrogen gas from the nitrogen gas supply source to the respective discharge ports 16.

The lower suction mechanism 5 includes branch connection tubes 39 connected to the respective suction channels 19 at one end, and a collecting suction tube 40 to which the other ends of the branch connection tubes 39 are connected commonly. The collecting suction tube 40 extends to the outside of the processing chamber 1. The tip end of the collecting suction tube 40 (the downstream end of the collecting suction tube 40 in a fluid flowing direction) is connected to a Convum 41 for evacuating air from the inside of the collecting tube 40. Further, on the outside of the processing chamber 1, a processing liquid recovery tube 42 is branched and connected to the collecting suction tube 40. The tip end of the processing liquid recovery tube 42 (the downstream end of the processing liquid recovery tube 42 in a fluid flowing direction) is connected to the processing liquid tank 33. A recovery valve 43 that opens and closes the processing liquid recovery tube 42, a filter 44 that removes foreign matter from a fluid (hydrofluoric acid) flowing through the processing liquid recovery tube 42, and a recovery pump 45 that draws hydrofluoric acid into the processing liquid recovery tube 42 are interposed somewhere in the middle of in the processing liquid recovery tube 42 in this order from the collecting suction tube 40 side. Further, a suction valve 46 that opens and closes the collecting suction tube 40 is interposed in the collecting suction tube 40 at a position closer to the tip end than the portion connected to the processing liquid recovery tube 42.

According to the configuration as above, by closing the recovery valve 43, opening the suction valve 46, and driving the Convum 41 while hydrofluoric acid, DIW, IPA, or a nitrogen gas is discharged from the discharge ports 16 in the bottom plate 2, it is possible to suck hydrofluoric acid, DIW, IPA, or a nitrogen gas being discharged from the discharge ports 16 into the Convum 41 through the suction ports 17 and the suction channels 19 in the bottom plate 2, the branch connection tubes 39, and the collecting suction tube 40. Further, by closing the suction valve 46, opening the recovery valve 43, and driving the recovery pump 45 while hydrofluoric acid is discharged from the discharge ports 16 in the bottom plate 2, it is possible to recover hydrofluoric acid being discharged from the discharge ports 16 to the processing liquid tank 33 by suction through the suction ports 17 in the bottom plate 2 via the suction channels 19, the branch connection tubes 39, the collecting suction tube 40, and the processing liquid recovery tube 42.

The upper supply mechanism 6 is configured to be able to selectively supply hydrofluoric acid, DIW (deionized pure water), IPA (isopropyl alcohol), and a nitrogen gas to the discharge ports 22 via the supply channels 24 in the top plate 3.

More specifically, the upper supply mechanism 6 includes branch connection tubes 47 connected to the respective supply channels 24 at one end, and a collecting supply tube 48 to which the other ends of the branch supply tubes 47 are connected commonly. The collecting supply tube 48 extends to the outside of the processing chamber 1. On the outside of the processing chamber 1, a processing liquid supply tube 49, a DIW supply tube 50, an IPA supply tube 51, and a nitrogen gas supply tube 52 are connected to the collecting supply tube 48. The processing liquid supply tube 49 extends from a processing liquid tank 53 storing hydrofluoric acid. A processing liquid pump 54 that pumps up hydrofluoric acid out of the processing liquid tank 53 and a processing liquid valve 55 that opens and closes the processing liquid supply tube 49 are interposed somewhere in the middle of the processing liquid supply tube 49. DIW from an unillustrated DIW supply source is supplied to the DIW supply tube 50. A DIW valve 56 that opens and closes the DIW supply tube 50 is interposed somewhere in the middle of the DIW supply tube 50. IPA from an unillustrated IPA supply source is supplied to the IPA supply tube 51. An IPA valve 57 that opens and closes the IPA supply tube 51 is interposed somewhere in the middle of the IPA supply tube 51. A nitrogen gas from an unillustrated nitrogen gas supply source is supplied to the nitrogen gas supply tube 52. A nitrogen gas valve 58 that opens and closes the nitrogen gas supply tube 52 is interposed somewhere in the middle of the nitrogen gas supply tube 52.

According to the configuration as above, by closing the DIW valve 56, the IPA valve 57, and the nitrogen gas valve 58 and opening the processing liquid valve 55 and by driving the processing liquid pump 54, it is possible to supply hydrofluoric acid stored in the processing liquid tank 53 to the respective discharge ports 22. Further, by closing the processing liquid valve 55, the IPA valve 57, and the nitrogen gas valve 58 and opening the DIW valve 56, it is possible to supply DIW from the DIW supply source to the respective discharge ports 22. Further, by closing the processing liquid valve 55, the DIW valve 56, and the nitrogen gas valve 58 and opening the IPA valve 57, it is possible to supply the IPA from the IPA supply source to the respective discharge ports 22. Furthermore, by closing the processing liquid valve 55, the DIW valve 56, and the IPA valve 57 and opening the nitrogen gas valve 58, it is possible to supply the nitrogen gas from the nitrogen gas supply source to the respective discharge ports 22.

The upper suction mechanism 7 includes branch connection tubes 59 connected to the respective suction channels 25 at one end, and a collecting suction tube 60 to which the other ends of the branch connection tubes 59 are connected commonly. The collecting suction tube 60 extends to the outside of the processing chamber 1. The tip end of the collecting suction tube 60 (the downstream end of the collecting suction tube 60 in a fluid flowing direction) is connected to a Convum 61 for evacuating air from the inside of the collecting tube 60. Further, on the outside of the processing chamber 1, a processing liquid recovery tube 62 is branched and connected to the collecting suction tube 60. The tip end of the processing liquid recovery tube 62 (the downstream end of the processing liquid recovery tube 62 in a fluid flowing direction) is connected to the processing liquid tank 53. A recovery valve 63 that opens and closes the processing liquid recovery tube 62, a filter 64 that removes foreign matter from a fluid (hydrofluoric acid) flowing through the processing liquid recovery tube 62, and a recovery pump 65 that draws hydrofluoric acid into the processing liquid recovery tube 62 are interposed somewhere in the middle of the processing liquid recovery tube 62 in this order from the collecting suction tube 60 side.

Further, a suction valve 66 that opens and closes the collecting suction tube 60 is interposed in the collecting suction tube 60 at a position closer to the tip end than the portion connected to the processing liquid recovery tube 62.

According to the configuration as above, by closing the recovery valve 63, opening the suction valve 66, and driving the Convum 61 while hydrofluoric acid, DIW, IPA, or a nitrogen gas is discharged from the discharge ports 22 in the top plate 3, it is possible to suck hydrofluoric acid, DIW, IPA, or a nitrogen gas being discharged from the discharge ports 22 into the Convum 61 through the suction ports 23 and the suction channels 25 in the top plate 3, the branch connection tubes 59, and the collecting suction tube 60. Further, by closing the suction valve 66, opening the recovery valve 63, and driving the recovery pump 65 while hydrofluoric acid is discharged from the discharge ports 22 in the top plate 3, it is possible to recover hydrofluoric acid being discharged from the discharge ports 22 to the processing liquid tank 53 by suction through the suction ports 23 in the top plate 3 via the suction channels 25, the branch connection tubes 59, the collecting suction tube 60, and the processing liquid recovery tube 62.

Figure 2:
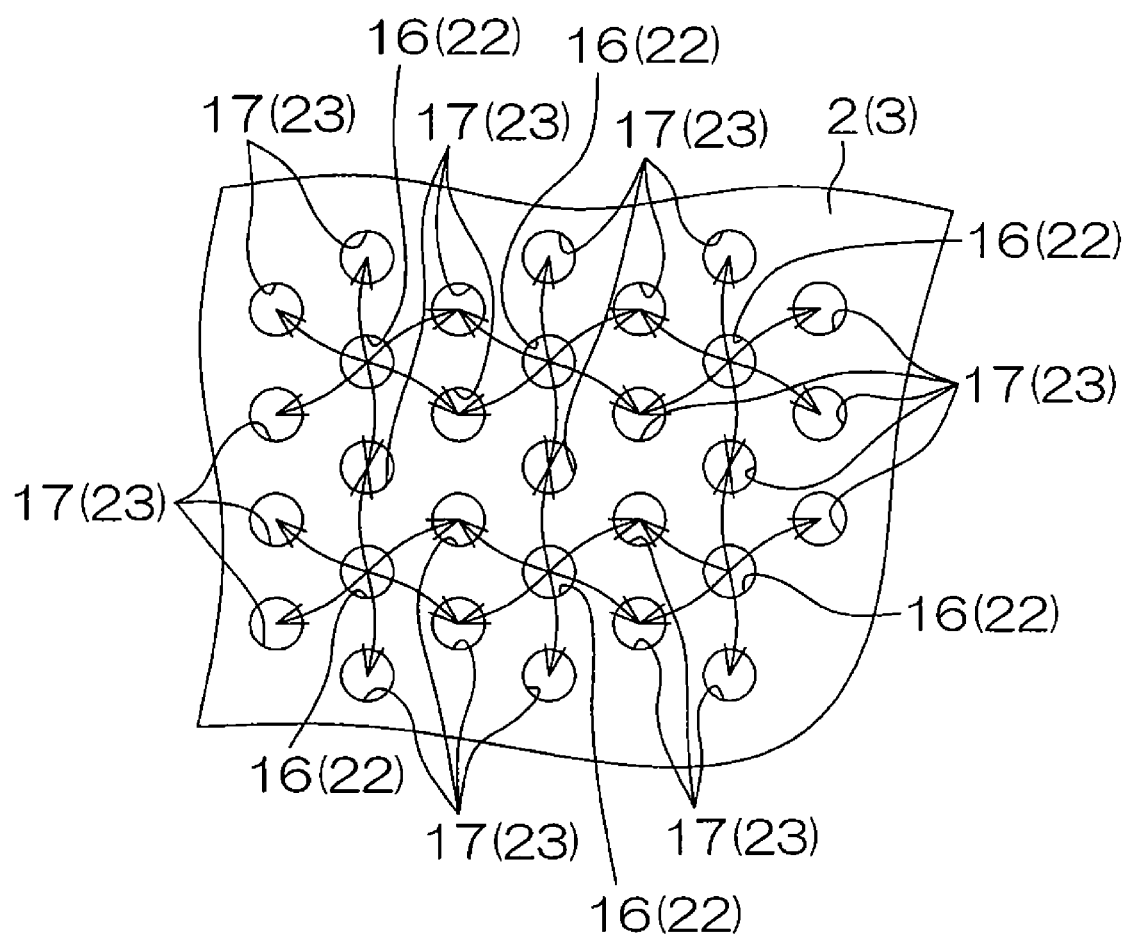
FIG. 2 is a plan view of the top surface of a bottom plate (the bottom surface of a top plate) shown in FIG. 1.

FIG. 2 is a plan view showing the top surface of the bottom plate 2 (the bottom surface of the top plate 3).

On the top surface of the bottom plate 2 (the bottom surface of the top plate 3), for example, the discharge ports 16 (22) are disposed in a matrix fashion at regular intervals in a first direction and a second direction orthogonal to the first direction. The suction ports 17 (23) are disposed around any discharge port 16 (22), for example, at positions of the respective apexes of a regular hexagon about the discharge port 16 (22).

According to this configuration, as is indicated by arrows in FIG. 2, hydrofluoric acid, DIW, IPA, or a nitrogen gas discharged from each discharge port 16 (22) flows as it is distributed generally uniformly to the six suction ports 17 (23) around the discharge port 16 (22).

Referring to FIG. 1 again, when the wafer W is processed by the substrate processing apparatus, the shutter 13 is opened, and the wafer W is carried into the processing chamber 1 through the opening 12 by the hand of an unillustrated substrate carrying robot. At this time, the top plate 3 has been moved up to a wafer delivery position (the position indicated by a solid line of FIG. 1) at the uppermost portion. The wafer W carried in by the hand of the substrate carrying robot is disposed at a position at which the back surface opposes the bottom surface of the top plate 3 in the proximity thereof.

In this state, a nitrogen gas is discharged from the discharge ports 22 in the top plate 3, and the discharged nitrogen gas is sucked into the suction ports 23. Accordingly, a flow of nitrogen gas described with reference to FIG. 2 is produced in a space between the bottom surface of the top plate 3 and the back surface (top surface) of the wafer W. This flow of nitrogen gas enables holding by attraction in a non-contact state in which the back surface of the wafer W is spaced apart from the bottom surface of the top plate 3 by a specific distance.

Subsequently, the hand of the substrate carrying robot goes out from the processing chamber 1 and the shutter 13 is closed. After the shutter 13 is closed, the top plate 3 is moved down to a position (the position indicated by a chain double-dashed line in FIG. 1) at which it opposes the bottom plate 2 with a specific distance. Hydrofluoric acid is then discharged from the discharge ports 16 in the bottom plate 2, and the discharged hydrofluoric acid is sucked into the suction ports 17. Further, the discharge of nitrogen gas from the discharge ports 22 in the top plate 3 is stopped. Instead, hydrofluoric acid is discharged from the discharge ports 22, and the discharged hydrofluoric acid is sucked into the suction ports 23.

Accordingly, flows of hydrofluoric acid as described with reference to FIG. 2 are produced in a space between the top surface of the bottom plate 2 and the front surface (bottom surface) of the wafer W and in a space between the bottom surface of the top plate 3 and the back surface (top surface) of the wafer W. These flows of hydrofluoric acid enable holding by attraction in a non-contact state in which the front surface of the wafer W is spaced apart from the top surface of the bottom plate 2 by a specific distance, and holding by attraction in a non-contact state in which the back surface of the wafer W is also spaced apart from the bottom surface of the top plate 3 by a specific distance. At this time, the guide pins 20 oppose the edge face of the wafer W and a movement of the wafer W in the horizontal direction is limited by the guide pins 20. Because the front surface and the back surface of the wafer W held by attraction are wetted by hydrofluoric acid, rinse processing with hydrofluoric acid is applied to the front surface and the back surface of the wafer W.

At this time, the suction valves 46 and 66 are closed, the recovery valves 43 and 63 are opened, and the recovery pumps 45 and 65 are driven. Hydrofluoric acid is then sucked through the respective suction ports 17 and 23 by suction forces of the recovery pumps 45 and 65. Hydrofluoric acid thus sucked is recovered into the processing liquid tanks 33 and 53.

When a pre-set processing time (for example, 30 to 60 seconds) has passed since the start of the rinse processing with hydrofluoric acid, the supply of hydrofluoric acid from the discharge ports 16 in the bottom plate 2 and the discharge ports 22 in the top plate 3 is stopped. Further, the recovery pumps 45 and 65 are stopped and the recovery valves 43 and 63 are closed. Meanwhile, the suction valves 46 and 66 are opened. In addition, the Convums 41 and 61 are driven. DIW is then discharged from the discharge ports 16 in the bottom plate 2 and the discharge ports 22 in the top plate 3. DIW discharged from the discharge ports 16 and 22 is sucked into the suction ports 17 and 23 and guided to the Convums 41 and 61 by suction forces of the Convums 41 and 61, and released from the Convums 41 and 61 to an unillustrated waste solution facility for disposal. Accordingly, flows of the DIW are produced in a space between the top surface of the bottom plate 2 and the front surface of the wafer W and in a space between the bottom surface of the top plate 3 and the back surface of the wafer W. These flows of DIW enable DIW to rinse away hydrofluoric acid adhering onto the front surface and the back surface of the wafer W while the wafer W is maintained in a state where it is held by attraction by the bottom plate 2 and the top plate 3.

When a pre-set rinse time (for example, 60 seconds) has passed since the start of the discharge of DIW, the supply of DIW from the discharge ports 16 in the bottom plate 2 and the discharge ports 22 in the top plate 3 is stopped. Instead, IPA is discharged from the discharge ports 16 and 22. At this time, the suction valves 46 and 66 are opened and the Convums 41 and 61 are kept driven. Hence, IPA discharged from the discharge ports 16 and 22 is sucked into the suction ports 17 and 23 and guided to the Convums 41 and 61 by suction forces of the Convums 41 and 61, and released from the Convums 41 and 61 to the unillustrated waste solution facility for disposal. Accordingly, flows of IPA are produced in a space between the top surface of the bottom plate 2 and the front surface of the wafer W and in a space between the bottom surface of the top plate 3 and the back surface of the wafer W. The flows of IPA enable replacement of the DIW adhering onto the front surface and the back surface of the wafer W with IPA while the wafer W is maintained in a state where it is held by attraction by the bottom plate 2 and the top plate 3.

When a pre-set replacement time (for example, 60 seconds) has passed since the start of the discharge of IPA, the supply of IPA from the discharge ports 16 in the bottom plate 2 and the discharge ports 22 in the top plate 3 is stopped. Instead, a nitrogen gas is discharged from the discharge ports 16 and 22. At this time, the suction valves 46 and 66 are opened and the Convums 41 and 61 are kept driven. Hence, the nitrogen gas discharged from the discharge ports 16 and 22 is sucked into the suction ports 17 and 23 and guided to the Convums 41 and 61 by suction forces of the Convums 41 and 61, and exhausted from the Convums 41 and 61 to an unillustrated exhaust facility. Accordingly, flows of nitrogen gas are produced in a space between the top surface of the bottom plate 2 and the front surface of the wafer W and in a space between the bottom surface of the top plate 3 and the back surface of the wafer W. These flows of nitrogen gas enable a nitrogen gas to be supplied to the front surface and the back surface of the wafer W while the wafer W is maintained in a state where it is held by attraction by the bottom plate 2 and the top plate 3. The front surface and the back surface of the wafer W are dried quickly by the supply of the nitrogen gas and owing to the volatility characteristic of IPA.

When a pre-set drying time (for example, 30 seconds) has passed since the start of the discharge of nitrogen gas, the supply of nitrogen gas from the discharge ports 16 in the bottom plate 2 is stopped and the Convum 41 is stopped, too. Subsequently, the top plate 3 is moved up to the wafer delivery position at the uppermost portion. At this time, the discharge of nitrogen gas from the discharge ports 22 in the top plate 3 is continued and the Convum 61 is kept driven. The wafer W is moved up together with the top plate 3 while it is held by attraction by the bottom surface of the top plate 3 in a non-contact state. Subsequently, the shutter 13 is opened and the hand of the unillustrated substrate carrying robot comes into the processing chamber 1 through the opening 12. The hand goes under the wafer W attracted to the bottom surface of the top plate 3 in a non-contact state, and the discharge of nitrogen gas from the discharge ports 22 in the top plate 3 and the driving of the Convum 61 are stopped. The wafer W thus drops onto the hand of the substrate carrying robot and is held by the hand. Subsequently, the hand holding the wafer W goes out from the processing chamber 1, and a series of processing steps for the wafer W is completed.

As has been described, the front surface of the wafer W and the bottom plate 2 are disposed oppositely, and by discharging hydrofluoric acid toward the front surface of the wafer W from the discharge ports 16 made in the bottom plate 2 while sucking hydrofluoric acid through the suction ports 17 made in the bottom plate 2, a flow of hydrofluoric acid is produced in a space between the bottom plate 2 and the front surface of the wafer W. The flow of hydrofluoric acid enables holding by attraction in a non-contact state in which the front surface of the wafer W is spaced apart from the bottom plate 2 by a specific distance. At this time, the front surface of the wafer W is wetted by hydrofluoric acid and the processing with hydrofluoric acid is thus applied to the front surface of the wafer W. Meanwhile, the back surface of the wafer W on the opposite side of the front surface and the top plate 3 are disposed oppositely, and by discharging hydrofluoric acid toward the back surface of the wafer W from the discharge ports 22 made in the top plate 3 while sucking hydrofluoric acid through the suction ports 23 made in the top plate 3, a flow of hydrofluoric acid is produced in a space between the top plate 3 and the back surface of the wafer W. The flow of hydrofluoric acid enables holding by attraction in a non-contact state in which the back surface of the wafer W is spaced apart from the top plate 3 by a specific distance. In other words, the wafer W is held by attraction in a non-contact state in which it is spaced apart from the bottom plate 2 by a specific distance while at the same time it is held by attraction in a non-contact state in which it is also spaced apart from the top plate 3 by a specific distance. At this time, both the front surface and the back surface of the wafer W are wetted by hydrofluoric acid, and the processing with hydrofluoric acid is thus applied to the both surfaces of the wafer W. Hence, the wafer W can be held in a non-contact state, and yet it is still possible to achieve the processing on the both surfaces of the wafer W concurrently.

In addition, the lower supply mechanism 4 includes the DIW supply tube 30 and the DIW valve 36, and the upper supply mechanism 6 includes the DIW supply tube 50 and the DIW valve 56. Following the rinse processing with hydrofluoric acid, DIW is supplied to the discharge ports 16 in the bottom plate 2 by the lower supply mechanism 4 and DIW is supplied to the discharge ports 22 in the top plate 3 by the upper supply mechanism 6. DIW is then discharged from the discharge ports 16 and 22. It is thus possible to rinse away hydrofluoric acid adhering onto the front surface and the back surface of the wafer W with DIW.

Further, the lower supply mechanism 4 includes the IPA supply tube 31 and the IPA valve 37, and the upper supply mechanism 6 includes the IPA supply tube 51 and the IPA valve 57. Following the rinse processing with DIW, IPA is supplied to the discharge ports 16 in the bottom plate 2 by the lower supply mechanism 4 and IPA is supplied to the discharge ports 22 in the top plate 3 by the upper supply mechanism 6. IPA is then discharged from the discharge ports 16 and 22. It is thus possible to replace DIW adhering onto the front surface and the back surface of the wafer W with IPA, which can accelerate the drying of DIW owing to the volatility characteristic of IPA. A time needed for the processing to dry the wafer W can be therefore shortened.

Furthermore, the lower supply mechanism 4 includes the nitrogen gas supply tube 32 and the nitrogen gas valve 38, and the upper supply mechanism 6 includes the nitrogen gas supply tube 52 and the nitrogen gas valve 58. Following the supply of IPA, a nitrogen gas is supplied to the discharge ports 16 in the bottom plate 2 by the lower supply mechanism 4 and a nitrogen gas is supplied to the discharge ports 22 in the top plate 3 by the upper supply mechanism 6. The nitrogen gas is then discharged from the discharge ports 16 and 22. It is thus possible to dry both the front surface and the back surface of the wafer W quickly while leaving a water mark (a trace of drying) on neither surface.

The top plate 3 serves also as a substrate carrier mechanism that receives the wafer W from the hand of the unillustrated substrate carrying robot and then carries the wafer W to a position opposing the bottom plate 2 in the proximity thereof. Hence, in comparison with a case where such a substrate carrier mechanism and top plate 3 are provided separately, the configuration can be simpler and the cost can be saved.

The elevation driving mechanism 26 is coupled to the top plate 3. The elevation driving mechanism 26 allows the bottom plate 2 and the top plate 3 to come closer and move apart relatively to each other. Hence, by allowing the top plate 3 and the bottom plate 2 to move apart from each other when the wafer W is carried in and out, the wafer W can be carried in and out smoothly.

In the substrate processing apparatus, the processing liquid sucked through the suction ports 17 in the bottom plate 2 is recovered to the processing liquid tank 33 via the processing liquid recovery tube 42, while the processing liquid sucked through the suction ports 23 in the top plate 3 is recovered to the processing liquid tank 53 via the processing liquid recovery tube 62, so that these processing liquids can be reused for the processing on the wafer W. It is thus possible to prevent wasting of the processing liquid, which can in turn reduce a quantity of the consumed processing liquid.

Figure 3:
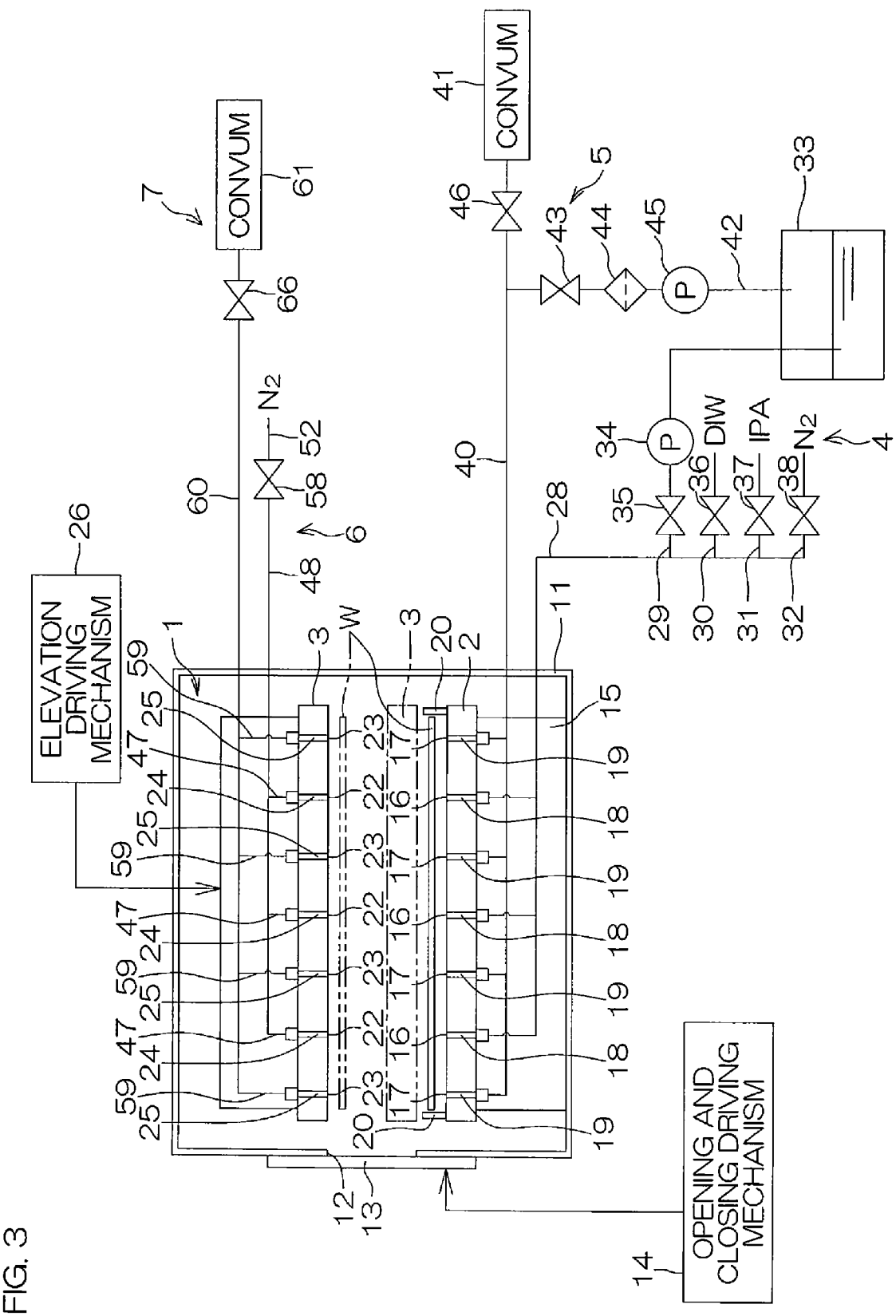
FIG. 3 is a cross sectional view schematically showing the configuration of a substrate processing apparatus according to another embodiment of the invention.

FIG. 3 is a cross sectional view schematically showing the configuration of a substrate processing apparatus according to another embodiment of the invention. In FIG. 3, portions corresponding to those shown in FIG. 1 are labeled with the same reference numerals. Hereinafter, a detailed description of the portions labeled with the same reference numerals is omitted.

In the substrate processing apparatus shown in FIG. 3, the upper supply mechanism 6 connected to the top plate 3 is configured to be able to supply the discharge ports 22 with a nitrogen gas alone via the supply channels 24 in the top plate 3. More specifically, the upper supply mechanism 6 includes branch connection tubes 47 connected to the respective supply channels 24 at one end, a collecting supply tube 48 to which the other ends of the branch supply tubes 47 are connected commonly, and on the outside of the processing chamber 1, a nitrogen gas supply tube 52 connected to the collecting supply tube 48. A nitrogen gas valve 58 that opens and closes the nitrogen gas supply tube 52 is interposed somewhere in the middle of the nitrogen gas supply tube 52.

Further, the upper suction mechanism 7 connected to the top plate 3 includes branch connection tubes 59 connected to the respective supply channels 25 at one end, a collecting suction tube 60 to which the other ends of the branch supply tube 59 are connected commonly, a Convum 61 to evacuate air from the inside of the collecting tube 60, and a suction valve 66 that opens and closes the collecting suction tube 60. Different from the upper suction mechanism 7 shown in FIG. 1, the upper suction mechanism 7 shown in FIG. 3 is not provided with the processing liquid recovery tube 62, and the recovery valve 63, the filter 64, and the recovery pump 65 (see FIG. 1) interposed therein.

In this substrate processing apparatus, the front surface of the wafer W and the bottom plate 2 are disposed oppositely, and by discharging hydrofluoric acid, DIW, or IPA toward the front surface of the wafer W from the discharge ports 16 made in the bottom plate 2 while sucking hydrofluoric acid, DIW, or IPA through the suction ports 17 made in the bottom plate 2, a flow of hydrofluoric acid, DIW, or IPA is produced in a space between the bottom plate 2 and the front surface of the wafer W. The flow of hydrofluoric acid, DIW, or IPA enables holding by attraction in a non-contact state in which the front surface of the wafer W is spaced apart from the bottom plate 2 by a specific distance. At this time, the front surface of the wafer W is wetted by hydrofluoric acid, DIW, or IPA, and the processing with hydrofluoric acid, DIW, or IPA is thus applied to the front surface of the wafer W. Meanwhile, the top plate 3 is disposed oppositely to the back surface of the wafer W on the opposite side of the front surface, and by discharging a nitrogen gas toward the back surface of the wafer W from the discharge ports 22 made in the top plate 3 while sucking a nitrogen gas through the suction ports 23 made in the top plate 3, a flow of nitrogen gas is produced in a space between the top plate 3 and the back surface of the wafer W. The flow of nitrogen gas enables holding by attraction in a non-contact state in which the back surface of the wafer W is spaced apart from the top plate 3 by a specific distance. In other words, the wafer W is held by attraction in a non-contact state in which it is spaced apart from the bottom plate 2 by a specific distance while at the same time it is held by attraction in a non-contact state in which it is also spaced apart from the top plate 3 by a specific distance. At this time, hydrofluoric acid, DIW, or IPA supplied to the front surface of the wafer W is not allowed to go into a space between the back surface of the wafer W and the top plate 3 because of the flow of nitrogen gas produced in this space. It is thus possible to apply the processing with hydrofluoric acid, DIW, or IPA to the front surface of the wafer W while protecting the back surface of the wafer W.

Figure 4:
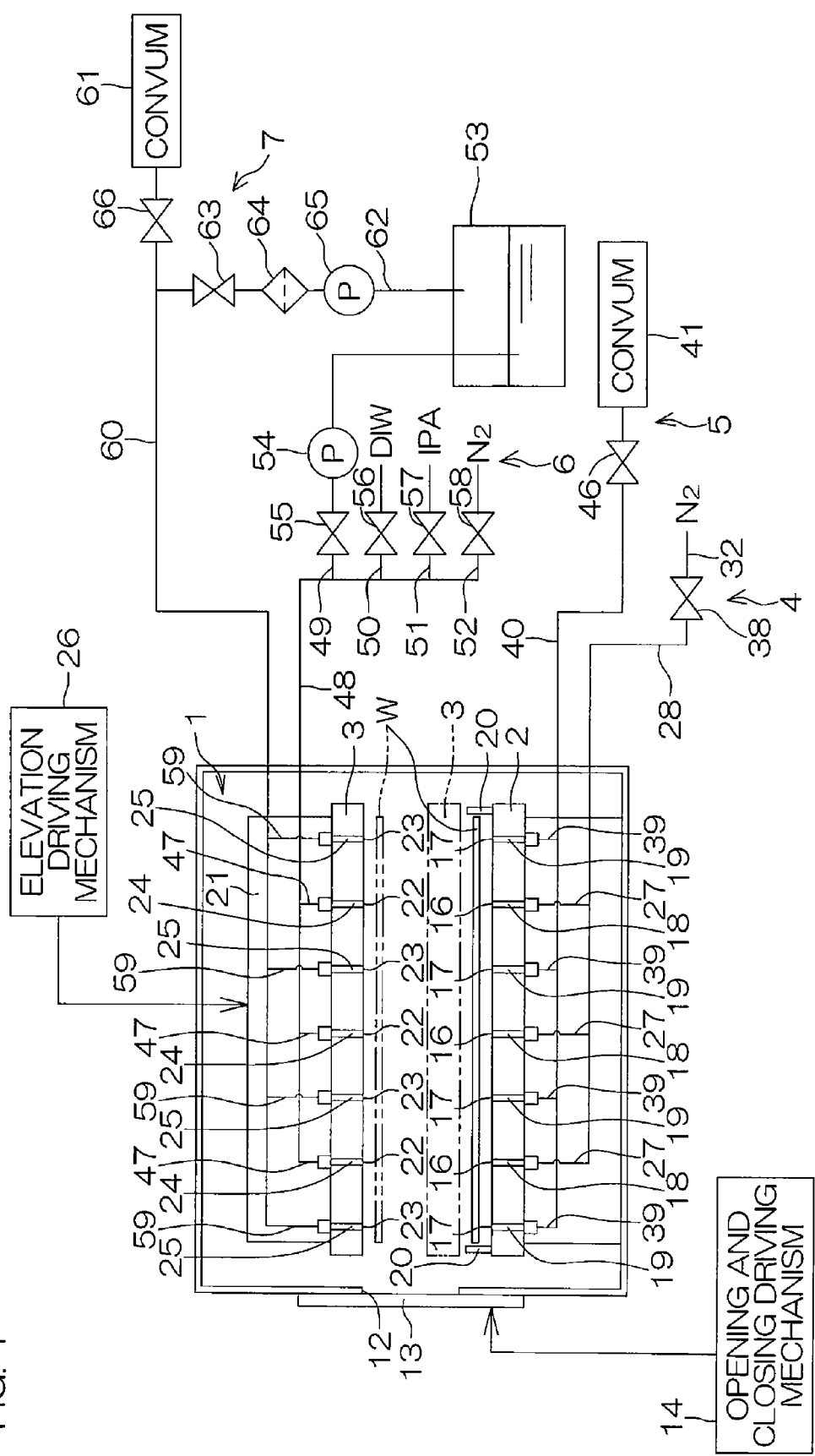
FIG. 4 is a cross sectional view schematically showing the configuration of a substrate processing apparatus according to still another embodiment of the invention.

FIG. 4 is a cross sectional view schematically showing the configuration of a substrate processing apparatus according to still another embodiment of the invention. In FIG. 4, portions corresponding to those shown in FIG. 1 are labeled with the same reference numerals. Hereinafter, a detailed description of the portions labeled with the same reference numerals is omitted.

In the substrate processing apparatus shown in FIG. 4, the bottom supply mechanism 4 connected to the bottom plate 2 is configured to be able to supply the discharge ports 16 with a nitrogen gas alone via the supply channels 18 in the bottom plate 2. More specifically, the lower supply mechanism 4 includes branch connection tubes 27 connected to the respective supply channels 18 at one end, a collecting supply tube 28 to which the other ends of the branch supply tubes 27 are connected commonly, and on the outside of the processing chamber 1, a nitrogen gas supply tube 32 connected to the collecting supply tube 28. A nitrogen gas valve 38 that opens and closes the nitrogen gas supply tube 32 is interposed somewhere in the middle of the nitrogen gas supply tube 32.

Further, the lower suction mechanism 5 connected to the bottom plate 2 includes branch connection tubes 39 connected to the respective supply channels 19 at one end, a collecting suction tube 40 to which the other ends of the branch supply tube 39 are connected commonly, a Convum 41 to evacuate air from the inside of the collecting tube 40, and a suction valve 46 that opens and closes the collecting suction tube 40. Different from the lower suction mechanism 5 shown in FIG. 1, the lower suction mechanism 5 shown in FIG. 4 is not provided with the processing liquid recovery tube 42, and the recovery valve 43, the filter 44, and the recovery pump 45 (see FIG. 1) interposed therein.

In this substrate processing apparatus, the front surface of the wafer W and the bottom plate 2 are disposed oppositely, and by discharging a nitrogen gas toward the front surface of the wafer W from the discharge ports 16 made in the bottom plate 2 while sucking a nitrogen gas through the suction ports 17 made in the bottom plate 2, a flow of nitrogen gas is produced in a space between the bottom plate 2 and the front surface of the wafer W. The flow of nitrogen gas enables holding by attraction in a non-contact state in which the front surface of the wafer W is spaced apart from the bottom plate 2 by a specific distance. Meanwhile, the back surface of the wafer W on the opposite side of the front surface and the top plate 3 are disposed oppositely, and by discharging hydrofluoric acid, DIW, or IPA toward the back surface of the wafer W from the discharge ports 22 made in the top plate 3 while sucking hydrofluoric acid, DIW, or IPA through the suction ports 23 made in the tope plate 3, a flow of hydrofluoric acid, DIW, or IPA is produced in a space between the top plate 3 and the back surface of the wafer W. The flow of hydrofluoric acid, DIW, or IPA enables holding by attraction in a non-contact state in which the back surface of the wafer W is spaced apart from the top plate 3 by a specific distance. In other words, the wafer W is held by attraction in a non-contact state in which it is spaced apart from the bottom plate 2 by a specific distance while at the same time it is held by attraction in a non-contact state in which it is also spaced apart from the top plate 3 by a specific distance. At this time, the back surface of the wafer W is wetted by hydrofluoric acid, DIW, or IPA, and the processing with hydrofluoric acid, DIW, or IPA is thus applied to the back surface of the wafer W. Hydrofluoric acid, DIW, or IPA supplied to the back surface of the wafer W is not allowed to go into a space between the front surface of the wafer W and the top plate 3 because of the flow of nitrogen gas produced in this space. It is thus possible to apply the processing with hydrofluoric acid, DIW, or IPA to the back surface of the wafer W while protecting the front surface of the wafer W.

Figure 5:
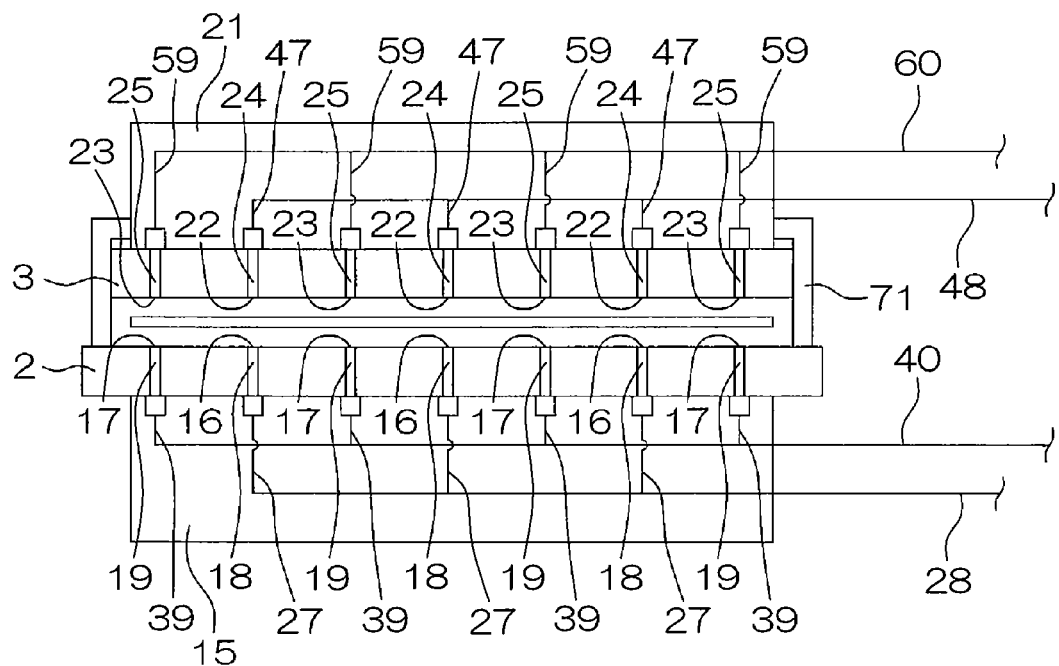
FIG. 5 is a cross sectional view schematically showing another configuration of the top plate.

FIG. 5 is a cross sectional view schematically showing another configuration of the top plate 3. In FIG. 5, portions corresponding to those shown in FIG. 1 are labeled with the same reference numerals. Hereinafter, a detailed description of the portions labeled with the same reference numerals is omitted.

The top plate 3 shown in FIG. 5 includes a sealing member 71 to seal a space between the outer edge portion of the bottom plate 2 and the outer edge portion of the top plate 3 by abutting on the outer edge portion of the bottom plate 2 during the processing of the wafer W that is disposed in close proximity to the bottom plate 2. The sealing member 71 is formed, for example, in the shape of an umbrella that is rotationally symmetric about the center line which is the vertical line passing the center of the top plate 3. More specifically, the sealing member 71 overhangs laterally from the entire periphery of the side surface of the support block 21 of the top plate 3 and protrudes downward below the bottom surface of the top plate 3 by running down on the side surfaces of the top plate 3. A packing made of a material having resistance to chemical liquids is attached to the lower end of the sealing member 71 around the entire periphery thereof.

According to this configuration, when the bottom plate 2 and the top plate 3 come into close proximity to each other and the lower end of the sealing member 71 abuts on the top surface of the bottom plate 2, a space between the outer edge portion of the bottom plate 2 and the outer edge portion of the top plate 3 is sealed, so that a space between the bottom plate 2 and the top plate 3 (a space surrounding the wafer W) can be made into a hermetically sealed space. This prevents ambient air containing hydrofluoric acid or the like from being diffused into the surrounding, and processing with hydrofluoric acid or the like can be applied to the wafer W. When this configuration is adopted, even when the opening 12 of the processing chamber 1 is not closed hermetically by the shutter 13 (see FIG. 1), it is possible to prevent ambient air containing hydrofluoric acid or the like from leaking into the outside of the processing chamber 1.

The sealing member 71 may be divided into a top half part and a bottom half part for the top half portion to be attached to the top plate 3 and the bottom half portion to the bottom plate 2, so that a space between the outer edge portion of the top plate 3 and the outer edge portion of the bottom plate 2 may be sealed by the sealing member 71 formed as the top half part and the bottom half part abut on each other when the top plate 3 and the bottom plate 2 come into close proximity to each other. Instead of the sealing member 71, a member having a vertically inverted configuration of the sealing member 71 may be attached to the plate support stand 15 of the bottom plate 2.

Figure 6:
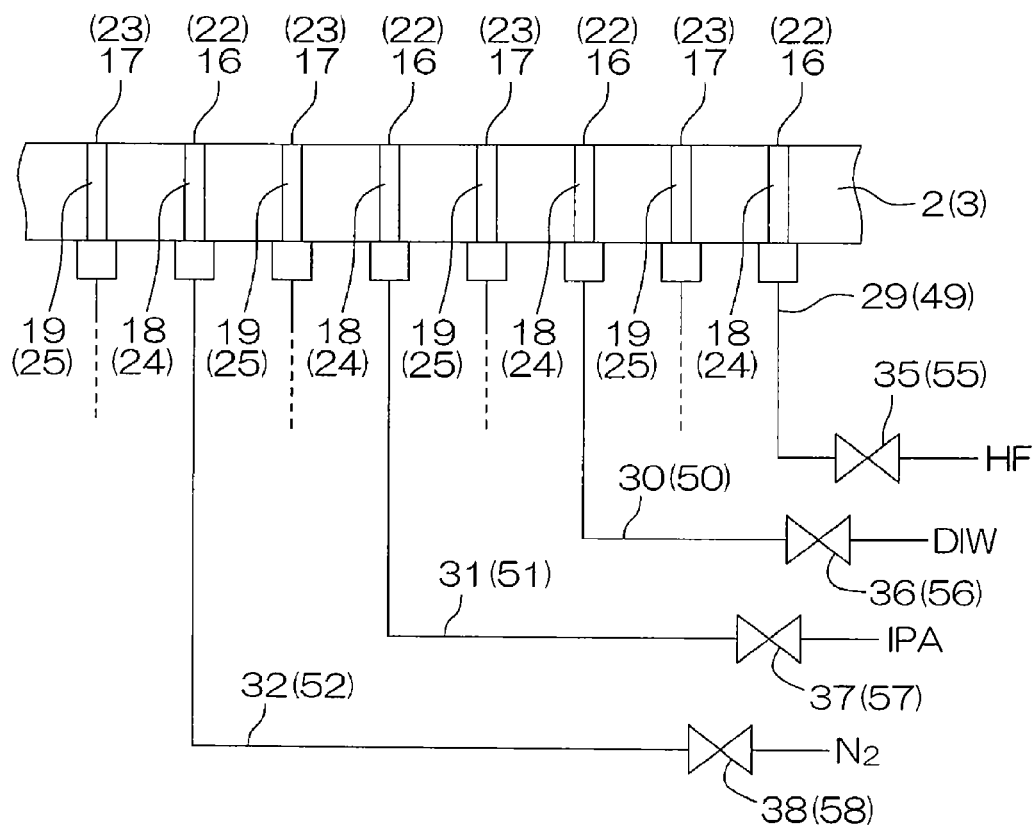
FIG. 6 is a cross sectional view schematically showing the configuration to supply hydrofluoric acid (HF), DIW, IPA, and a nitrogen gas to different discharge ports.

While several embodiments of invention have been described, the present invention can be practiced in other embodiments. For example, the above embodiments describe the configuration in which hydrofluoric acid, DIW, IPA, and a nitrogen gas are supplied to the common discharge ports 16 (22). However, the configuration as is shown in FIG. 6 may be adopted, in which a processing liquid supply tube 29 (49), a DIW supply tube 30 (50), an IPA supply tube 31 (51), and a nitrogen gas supply tube 32 (52) are directly connected to different supply channels 18 (24), so that hydrofluoric acid (HF), DIW, IPA, and a nitrogen gas are supplied to different discharge ports 16 (22). In the configuration in which hydrofluoric acid, DIW, IPA, and a nitrogen gas are supplied to the common discharge ports 16 (22), a total number of the discharge ports 16 (22) made in each of the bottom plate 2 and the top plate 3 is small in comparison with the configuration in which hydrofluoric acid, DIW, IPA, and a nitrogen gas are supplied to different discharge ports 16 (22). Consequently, the configuration of the bottom plate 2 (top plate 3) can be simpler. On the other hand, according to the configuration in which hydrofluoric acid, DIW, IPA, and a nitrogen gas are supplied to different discharge ports 16 (22), it is possible to prevent hydrofluoric acid, DIW, and IPA from mixing at the discharge ports 16 (22). It is thus possible to supply the wafer W with highly-pure hydrofluoric acid, DIW, and IPA, which enables satisfactory processing to be applied to the wafer W. Further, it is possible to prevent IPA or the like remaining at the discharge ports 16 (22) from being discharged together with a nitrogen gas when a nitrogen gas is discharged from the discharge ports 16 (22). It is therefore possible to prevent contamination of the wafer W resulting from an unwanted supply of IPA or the like.

In the embodiments described above, a chemical liquid of only one kind (hydrofluoric acid) is used for the processing on a single wafer W. However, the present invention is not limited to this configuration, and more than one kind of chemical liquid can be used sequentially. In this case, in FIG. 1, FIG. 3, and FIG. 4, plural tanks 53 are provided for plural kinds of chemical liquids, respectively, and valves are connected to the respective tanks to enable a selective switching among these chemical liquids. In a case where plural kinds of chemical liquids are used sequentially, the valve 57 is controlled between an interval of the switching of chemical liquids to allow pure water to flow through the channels 18 or the channels 24, so that a chemical liquid adhering to the inner surfaces of the channels 18 or 24 is rinsed away whenever the chemical liquids are switched.

The above embodiments describe a case where hydrofluoric acid, which is a chemical liquid, is used as the processing liquid, and the rinse processing with hydrofluoric acid is applied to the wafer W. However, for example, pure water may be used as the processing liquid, and rinse processing with the pure water may be applied to the wafer W. In this case, the processing liquid supply tube 29, the processing liquid tank 33, the processing liquid pump 34, and the processing liquid valve 35 may be omitted from the lower supply mechanism 4 shown in FIG. 1, and the processing liquid recovery tube 42, the recovery valve 43, the filter 44, and the recovery pump 45 may be omitted from the lower suction mechanism 5 shown in FIG. 1. Likewise, the processing liquid supply tube 49, the processing liquid tank 53, the processing liquid pump 54, and the processing liquid valve 55 may be omitted from the upper supply mechanism 6 shown in FIG. 1, and the processing liquid recovery tube 62, the recovery valve 63, the filter 64, and the recovery pump 65 may be omitted from the upper supply mechanism 7 shown in FIG. 1.

Figure 7:
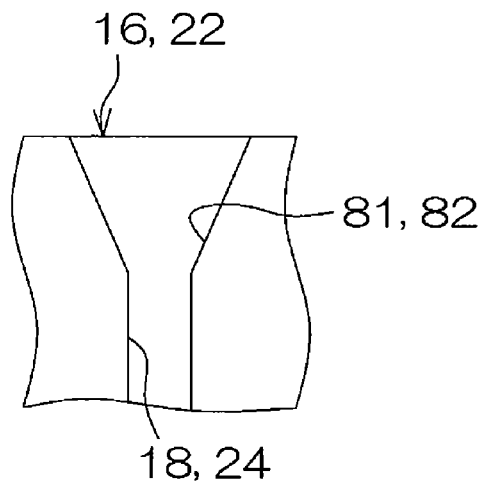
FIG. 7 is a cross sectional view schematically showing the configuration in which the connection portion of a supply channel to the discharge port is tapered.

Further, in the embodiments described above, the supply channels 18 in the bottom plate 2 and the supply channels 24 in the top plate 3 are formed generally in the shape of a circular column. However, as is shown in FIG. 7, they may be formed in a shape such that a connection portion 81 of the supply channel 18 to the discharge port 16 and a connection portion 82 of the supply channel 24 to the discharge port 22 have tapered cross sections that widen toward the discharge ports 16 and 22, and that the sectional areas of the connection portions 81 and 82 monotonously increase as a proximity to the discharge ports 16 and 22 increases. In this case, a pressure (discharge pressure) of the processing liquid or the like discharged from the discharge ports 16 and 22 can be dispersed in the horizontal direction (a direction parallel to the front surface and the back surface of the wafer W). It is thus possible to supply the processing liquid or the like uniformly to the front surface and the back surface of the wafer W.

Figure 8A:
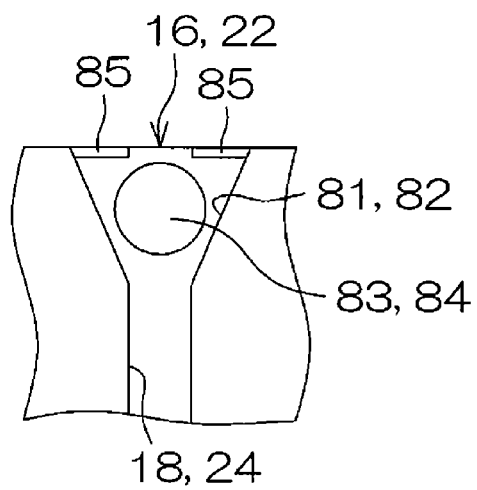
FIG. 8(a) is a cross sectional view and FIG. 8(b) is a plan view both schematically showing the configuration in which a discharge pressure dispersing ball is provided in the connection portion of the supply channel to the discharge port.
Figure 8B:
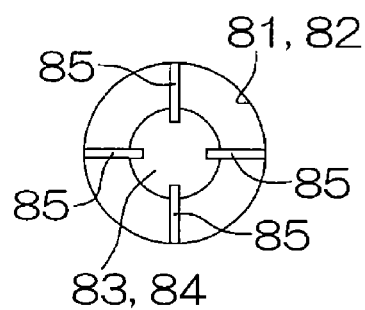

Further, as is shown in FIGS. 8(*a*) and 8(*b*), the connection portions 81 and 82 may be provided, respectively, with discharge pressure dispersing balls 83 and 84 to disperse a pressure of the processing liquid or the like discharged from the discharge ports 16 and 22. In this case, the processing liquid or the like flowing through the supply channels 18 and 24 flows through a space between the inner wall surfaces of the supply channels 18 and 24 and the discharge pressure dispersing balls 83 and 84, respectively. At this time, the discharge pressure dispersing balls 83 and 84 move within the supply channels 18 and 24, respectively, which makes it possible to disperse the pressure of the processing liquid or the like discharged from the discharge ports 16 and 22 in a more satisfactory manner. At the top ends (discharge ports 16 and 22) of the supply channels 18 and 24, claws 85 to prevent a fall-out of the discharge pressure dispersing balls 83 and 84 are formed at four positions displaced, for example, by 90° from one another.

In the embodiments described above, the suction ports 17 and 23 connected, respectively, to the Convum 41 and 61 are configured to perform suction alone. However, they may be configured in such a manner that the processing liquid including a chemical liquid, pure water, or the like, is discharged from the suction ports 17 or 23.

The above embodiments describe the rinse processing using hydrofluoric acid as an example. However, processing applied to the wafer W may be any processing using a processing liquid, and for example, the processing may be etching processing using an etching liquid, polymer removal processing using a polymer removal solution, or resist stripping processing using a resist stripping solution.

Figure 9:
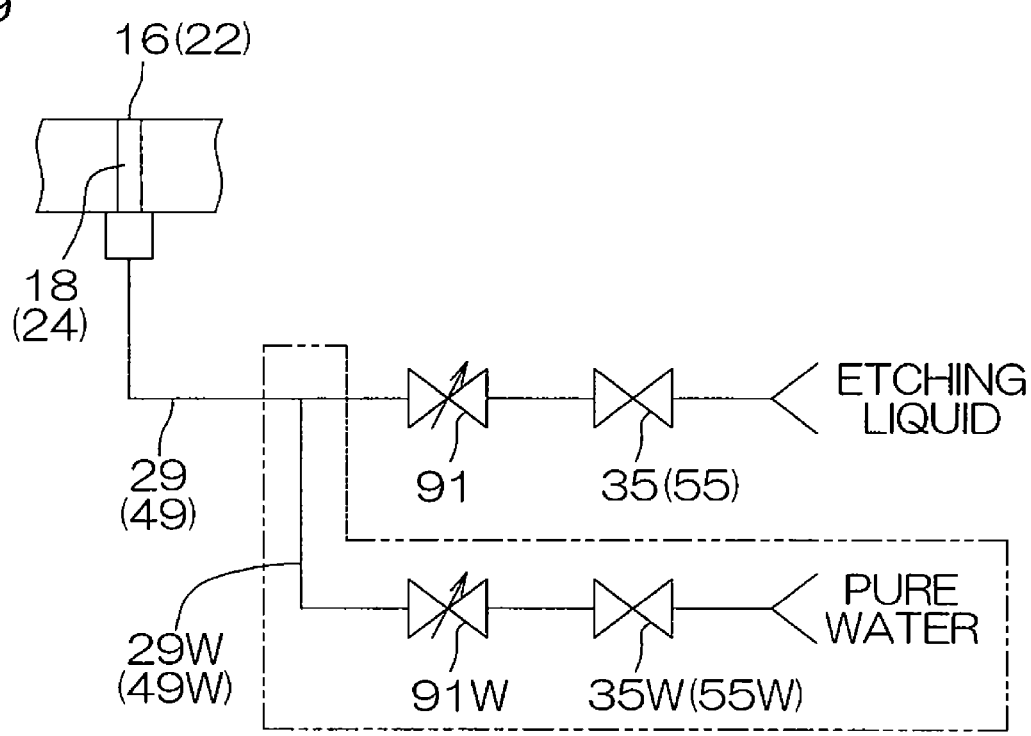
FIG. 9 is a view used to describe the configuration that enables the control of a flow rate of a processing liquid supplied to the discharge ports.

A flow rate of the processing liquid supplied to the respective discharge ports 16 (22) may be invariable (fixed), or alternatively, the flow rate of the processing liquid may be made variable by interposing, as is shown in FIG. 9, a flow rate adjusting valve 91 that adjusts a flow rate of the processing liquid flowing through the processing liquid supply tube 29 (49) somewhere in the middle of the processing liquid supply tube 29 (49). By controlling the opening of the flow rate adjusting valve 91 to control a flow rate of the processing liquid supplied to the respective discharge ports 16 (22), it is possible to adjust a rate of progress in the processing for the wafer W. For example, in a case where the processing for the wafer W is the etching processing, the etching rate can be adjusted by controlling a flow rate of an etching liquid supplied to the respective discharge ports 16 (22).

An inverter circuit that controls the pumping performance of the processing liquid pump 34 (54) may be provided instead of the flow rate adjusting valve 91, so that the flow rate of the processing liquid supplied to the respective discharge ports 16 (22) may be controlled by controlling the pumping performance. Alternatively, suction flow rate adjusting valves may be interposed somewhere in the middle of collecting suction tubes 40A and 60A (see FIG. 1), so that a flow rate at which the processing liquid is sucked through the respective suction ports 17 and 23 can be changed by controlling the openings of the suction flow rate adjusting valves in response to an increase and a decrease of the flow rate of the processing liquid to the respective discharge ports 16 and 22.

Further, as is shown inside a box indicated by a chain double-dashed line in FIG. 9, it may be configured in such a manner that a pure water supply tube 29W (49W) is connected to the processing liquid supply tube 29 (49) somewhere in the middle between the flow rate adjusting valve 91 and the supply channels 18 (24), and a pure water flow rate adjusting valve 91W and a pure water valve 35W (55W) are interposed in the pure water supply tube 29W (49W). In this case, by opening the processing liquid valve 35 (55) and the pure water valve 35W (55W) and adjusting at least one of the flow rate adjusting valve 91 and the pure water flow rate adjusting valve 91W as the need arises, it is possible to swiftly control the concentration (mixing ratio) of the processing liquid supplied to the wafer W. In particular, when the concentration of the processing liquid is controlled during the processing of the wafer W, the processing liquid is able to exert an effect in removing contamination fixedly adhering to the wafer W without leaving any damage to the devices formed on the wafer W.

Further, in the embodiments above, IPA is used as a drying accelerator fluid. However, instead of IPA, for example, an organic solvent having excellent hydrophilic properties and high volatility, such as acetone, MIBK (methyl isobutyl ketone) and MEK (methyl ethyl ketone), may be used. Alternatively, an organic solvent, such as HFE (hydrofluoro ether), may be used as well.

Further, instead of a nitrogen gas, other inert gases, such as a helium gas and an argon gas, can be used.

Further, during the processing of the wafer W, each of the bottom plate 2 and the top plate 3 may be rotated about the vertical axis line passing the center thereof.

Figure 10:
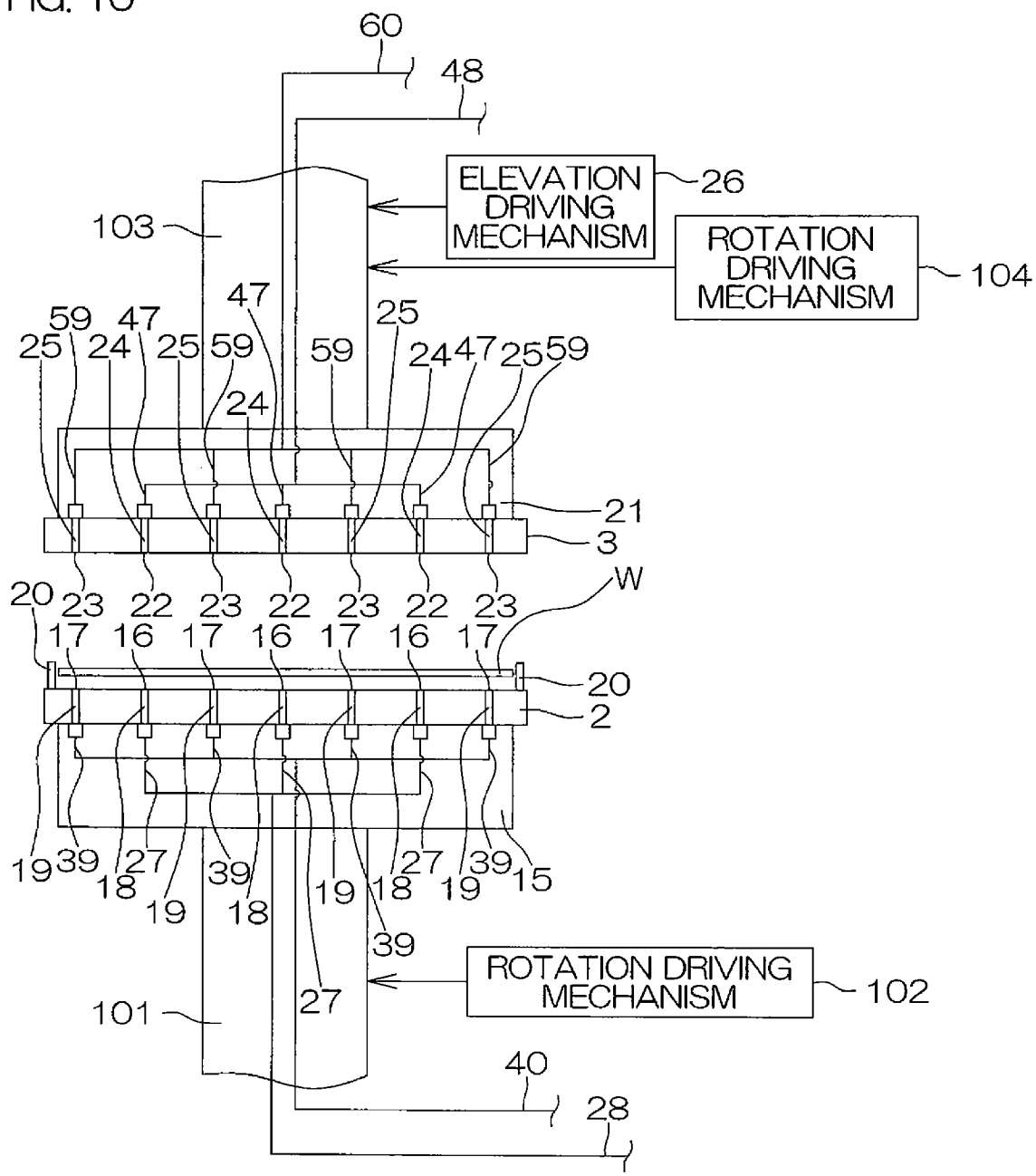
FIG. 10 is a cross sectional view schematically showing the configuration to rotate the top plate and the bottom plate.

An example of the configuration to rotate the bottom plate 2 and the top plate 3 is shown in FIG. 10. According to this configuration, a rotation shaft 101 extending along the vertical axis line passing the center of the bottom surface of the plate support stand 15 supporting the bottom plate 2 is coupled to the bottom surface. The rotation shaft 101 is a hollow shaft and the collecting supply tube 28 and the collecting suction tube 40 run through the hollow portion of the rotation shaft 101. A lower rotation driving mechanism 102 including a driving source, such as a motor, is coupled to the rotation shaft 101. By inputting a torque into the rotation shaft 101 from the lower rotation driving mechanism 102, the bottom plate 2 is allowed to rotate together with the plate support stand 15 and the rotation shaft 101 as a whole. Further, the elevation driving mechanism 26 is coupled to the rotation shaft 101, and by moving up and down the rotation shaft 101 along the center axis line thereof, the top plate 3 is moved up and down with respect to the bottom plate 2.

Meanwhile, a rotation shaft 103 extending along the vertical axis line passing the center of the top surface of the support block 21, to which the top plate 3 is fixed, is coupled to the top surface. The rotation shaft 103 is a hollow shaft. The collecting supply tube 48 and the collecting suction tube 60 run through the hollow portion of the rotation shaft 103. An upper rotation driving mechanism 104 including a driving source, such as a motor, is coupled to the rotation shaft 103. By inputting a torque into the rotation shaft 103 from the upper rotation driving mechanism 104, the top plate 3 is allowed to rotate together with the support block 21 and the rotation shaft 103 as a whole.

When the bottom plate 2 and the top plate 3 are rotated, the positions on the front surface of the wafer W opposing the respective discharge ports 16 in the bottom plate 2 and the positions on the back surface of the wafer W opposing the discharge ports 22 in the top plate 3 are changed. This makes it possible to prevent the processing liquid or the like from being supplied locally to both the front surface and the back surface of the wafer W with a strong force. It is thus possible to apply the processing with the processing liquid uniformly to both the front surface and the back surface of the wafer W.

The bottom plate 2 and the top plate 3 may be rotated in the same direction in sync with each other or at slightly different rotational velocities. Alternatively, the bottom plate 2 and the top plate 3 may be rotated in opposite directions.

Only one of the bottom plate 2 and the top plate 3 may be rotated. By rotating the top plate 3 while holding the wafer W using the bottom plate 2, the positions on the back surface of the wafer W opposing the respective discharge ports 22 in the top plate 3 can be changed. It is thus possible to apply the processing with the processing liquid uniformly to the back surface of the wafer W. Conversely, by rotating the bottom plate 2 while holding the wafer W using the top plate 3, the positions on the front surface of the wafer W opposing the respective discharge ports 16 in the bottom plate 2 can be changed. It is thus possible to apply the processing with the processing liquid or the like uniformly to the front surface of the wafer W.

Further, regarding the rotation direction of the bottom plate 2 and the top plate 3, the bottom plate 2 or the top plate 3 may be rotated repetitively and alternately in a forward direction (for example, a clockwise direction when viewed from the front surface side of the wafer) and in a backward direction (for example, a counter-clockwise direction when viewed from the front surface side of the wafer) once or more than once at a time. When configured in this manner, it is possible to apply the processing with the processing liquid or the like more uniformly to the front surface or the back surface of the wafer W.

As is indicated by a phantom line in FIG. 1, a pin rotation driving mechanism 92 may be coupled to at least one of the plural guide pins 20 provided to stand on the bottom plate 2, so that this guide pin 20 is rotated about the center axis line thereof. During the processing of the wafer W, by rotating the guide pin 20, the wafer W is allowed to rotate (rotate on its axis) on the bottom plate 2 about the axis line passing the center of the wafer W and orthogonal to the wafer W. Because the wafer W is held by attraction in a non-contact state by the bottom plate 2, it is able to rotate with quite a small force. Hence, even when the edge face of the wafer W does not constantly comes into contact with the rotated guide pin 20, a force needed for the wafer W to rotate can be imparted to the wafer W from the guide pin 20 by merely allowing the edge face of the wafer W to abut on the guide pin 20 instantaneously.

The wafer W may rotate (revolve) about the axis passing a point other than the center of the wafer W and orthogonal to a plane including the front surface of the wafer W. In this case, the wafer W may be allowed to revolve, for example, by allowing the plural guide pins 20 to revolve about the vertical axis lines passing positions displaced slightly from the respective guide pins 20 in sync with one another using the pin rotation driving mechanism 92.

By allowing the wafer W to rotate (rotate on its axis or revolve) as is described, it is possible to supply the processing liquid to the front surface (and the back surface) of the wafer W uniformly without any irregularities. The uniformity of the processing can be therefore enhanced.

Figure 11:
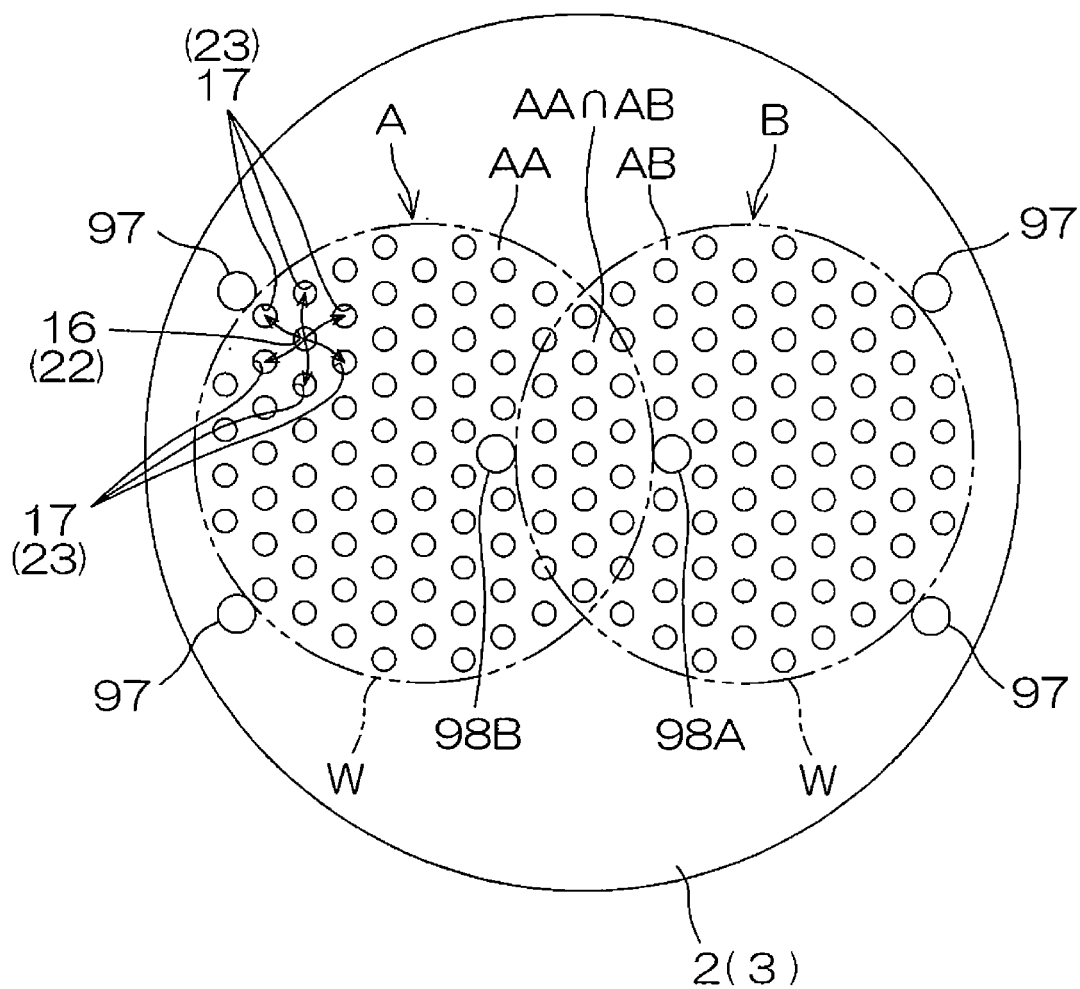
FIG. 11 is a view (a plan view of the top surface of the bottom plate (the bottom surface of the top plate)) used to describe a modification in which a wafer is allowed to move between two positions.

The above embodiments describe the configuration in which the wafer W remains generally at the same position on the bottom plate 2 and the top plate 3 while the processing is applied to the wafer W. However, as is shown in FIG. 11, the bottom plate 2 (top plate 3) may be formed to have a larger diameter than the wafer W, so that the position of the wafer W on the bottom plate 2 (top plate 3) is changed actively between a position A leaned to one side with respect to the center of the bottom plate 2 (top plate 3) and a position B leaned to the opposite side to the bottom plate 2 during the processing of the wafer W.

Figure 12:
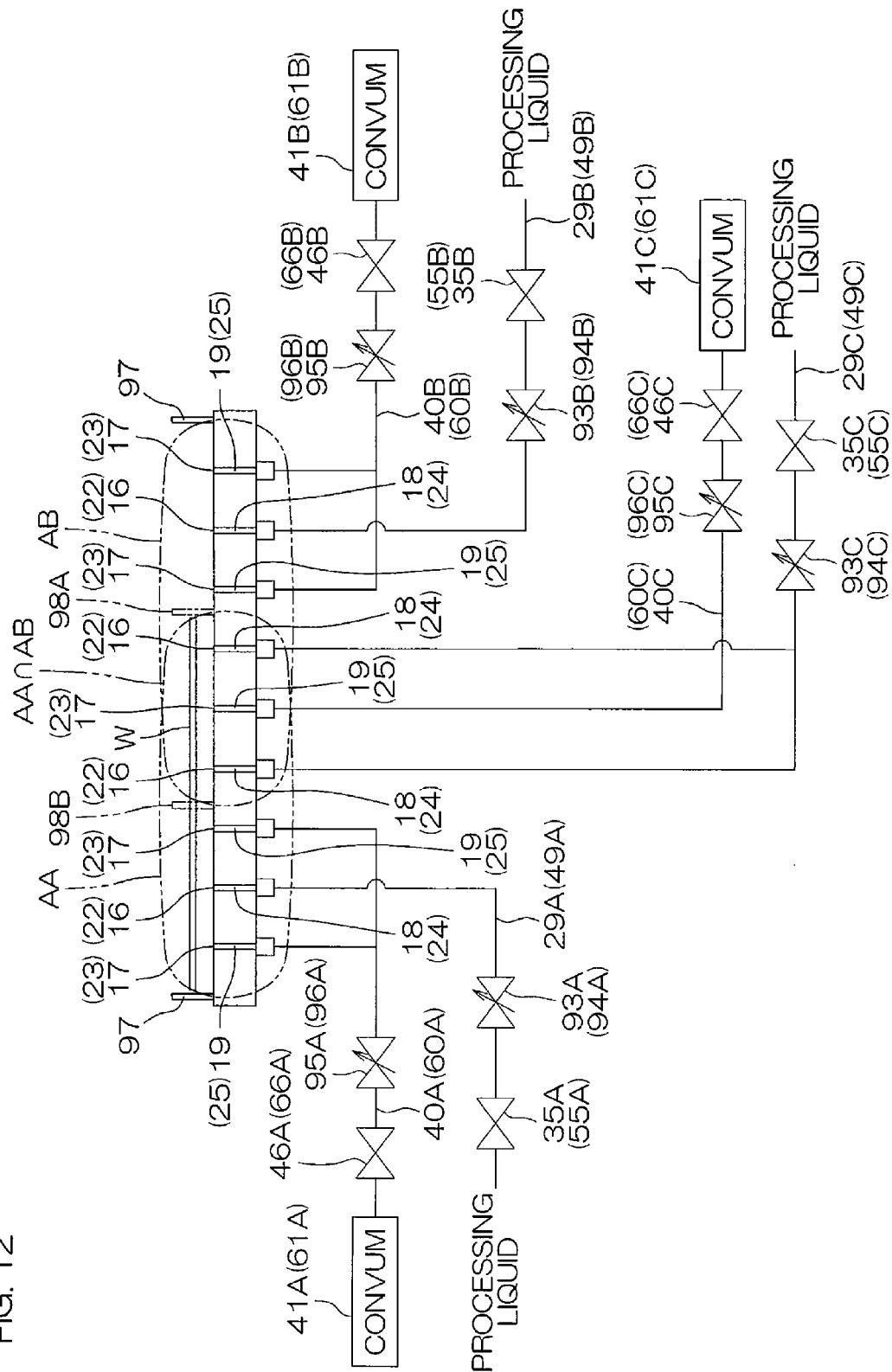
FIG. 12 is a view used to describe the configuration to move the wafer from one position to another.

FIG. 12 is a view used to describe the configuration to move the wafer W back and forth between the position A and the position B. Reference numerals of the respective portions of the top plate 3 are enclosed in parentheses and written next to those of the counterparts of the bottom plate 2.

A region (hereinafter, referred to as the region AA) opposing the wafer W disposed at the position A, a region (hereinafter, referred to as the region AB) opposing the wafer W disposed at the position B, and a region AA∩AB that is an overlapping portion of the region AA and the region AB, are defined on the top surface of the bottom plate 2 (top plate 3). The discharge ports 16 (22) and the suction ports 17 (23) made in the bottom plate 2 (top plate 3) are divided to those present in a region AA-AA∩AB that is part of the region AA excluding the region AA∩AB, those present in a region AB-AA∩AB that is part of the region AB excluding the region AA ∩AB, and those present in the region AA∩AB (including those present on the boundary).

Supply systems of the processing liquid to the discharge ports 16 (22) present in the region AA-AA∩AB, the discharge ports 16 (22) present in the region AB-AA∩AB, and the discharge ports 16 (22) present in the region AA∩AB are independent from one another. Further, suction systems of the processing liquid from the suction ports 17 (23) present in the region AA-AA∩AB, the suction ports 17 (23) present in the region AB-AA∩AB, and the suction ports 17 (23) present in the region AA∩AB are independent from one another.

The processing liquid is supplied to the discharge ports 16 (22) present in the region AA-AA∩AB via a processing liquid supply tube 29A (49A). A processing liquid valve 35A (55A) that opens and closes the processing liquid supply tube 29A (49A) and a discharge flow rate adjusting valve 93A (94A) that adjusts a flow rate of the processing liquid flowing through the processing liquid supply tube 29A (49A) are interposed somewhere in the middle of the processing liquid supply tube 29A (49A) Meanwhile, the insides of the suction ports 17 (23) present in the region AA-AA∩AB are sucked via a collecting suction tube 40A (60A) connected to a Convum 41A (61A). A suction valve 46A (66A) that opens and closes the collecting suction tube 40A (60A) and a suction flow rate adjusting valve 95A (96A) that adjusts a flow rate of the processing liquid flowing through the collecting suction tube 40A (60A) are interposed somewhere in the middle of the collecting suction tube 40A (60A).

The processing liquid is supplied to the discharge ports 16 (22) present in the region AB-AA∩AB via a processing liquid supply tube 29B (49B). A processing liquid valve 35B (55B) that opens and closes the processing liquid supply tube 29B (49B) and a discharge flow rate adjusting valve 93B (94B) that adjusts a flow rate of the processing liquid flowing through the processing liquid supply tube 29B (49B) are interposed somewhere in the middle of the processing liquid supply tube 29B (49B) Meanwhile, the insides of the suction ports 17 (23) present in the region AB-AA∩AB are sucked via a collecting suction tube 40B (60B) connected to a Convum 41B (61B). A suction valve 46B (66B) that opens and closes the collecting suction tube 40B (60B) and a suction flow rate adjusting valve 95B (96B) that adjusts a flow rate of the processing liquid flowing through the collecting suction tube 40B (60B) are interposed somewhere in the middle of the collecting suction tube 40B (60B).

The processing liquid is supplied to the discharge ports 16 (22) present in the region AA∩AB via a processing liquid supply tube 29C (49C). A processing liquid valve 35C (55C)

that opens and closes the processing liquid supply tube 29C (49C) and a discharge flow rate adjusting valve 93C (94C) that adjusts a flow rate of the processing liquid flowing through the processing liquid supply tube 29C (49C) are interposed somewhere in the middle of the processing liquid supply tube 29C (49C). Meanwhile, the insides of the suction ports 17 (23) present in the region AA∩AB are sucked via a collecting suction tube 40C (60C) connected to a Convum 41C (61C). A suction valve 46C (66C) that opens and closes the collecting suction tube 40C (60C) and a suction flow rate adjusting valve 95C (96C) that adjusts a flow rate of the processing liquid flowing through the collecting suction tube 40C (60C) are interposed somewhere in the middle of the collecting suction tube 40C (60C).

By adjusting the openings of the discharge flow rate adjusting valves 93A (94A), 93B (94B), 93C (94C) and the suction flow rate adjusting valves 95A (96A), 95B (96B), and 95C (96C), it is possible to adjust a flow rate of the processing liquid discharged from the discharge ports 16 (22) and a flow rate of the processing liquid sucked through the suction ports 17 (23) for each of the region AA-AA∩AB, the region AB-AA∩AB, and the region AA∩AB.

Because the configuration to supply the processing liquid to the processing liquid supply tubes 29A (49A), 29B (49B), and 29C (49C) is the same as the configuration to supply the processing liquid to the processing liquid supply tube 29 (49) shown in FIG. 1, it is not shown in the drawing and a description thereof is omitted herein. Likewise, because the configuration to recover the processing liquid from the collecting suction tubes 40A (60A), 40B (60B), and 40C (60C) is the same as the configuration to recover the processing liquid from the collecting suction tube 40 (60) shown in FIG. 1, it is not shown in the drawing and a description thereof is omitted herein.

In addition, four stationary guide pins 97 and two movable guide pins 98A and 98B are provided to stand on the bottom plate 2.

The four stationary guide pins 97 are disposed fixedly to the outer edge portion of the bottom plate 2. Two out of the four stationary guide pins 97 are disposed at positions at which they abut on the edge face of the wafer W when the wafer W moves to the position A, and the remaining two stationary guide pins 97 are disposed at positions at which they abut on the edge face of the wafer W when the wafer W moves to the position B.

The two movable guide pins 98A and 98B are disposed at the center portion of the bottom plate 2. The two movable guide pins 98A and 98B are provided in such a manner that they are able to travel backward and forward to be in a state where they protrude from the top surface of the bottom plate 2 and in a state where they come under the top surface of the bottom plate 2. One movable guide pin 98A is disposed at a position at which, when the wafer W moves to the position A, it abuts on the edge face of the wafer W from the opposite side of the two stationary guide pins 97 with the wafer W in between. The other movable guide pin 98B is disposed at a position at which, when the wafer W moves to the position B, it abuts on the edge face of the wafer W from the opposite side of the two stationary guide pins 97 with the wafer W in between.

While the wafer W is disposed at the position A, by opening the processing liquid valves 35A (55A) and 35C (55C) and the suction valves 46A (66A) and 46C (66C) for the processing liquid to be discharged from the discharge ports 16 (22) present in the region AA and for the discharged processing liquid to be sucked through the suction ports 17 (23) present in the region AA, the wafer W is held by attraction at the position A in a non-contact state in which it is spaced apart from the top surface of the bottom plate 2 (the bottom surface of the top plate 3) by a specific distance. At this time, the movable guide pin 98A is in a state where it protrudes from the top surface of the bottom plate 2, so that the two stationary guide pins 97 on the region AA side and one movable guide pin 98A limit the movement of the wafer W in the horizontal direction. It should be noted that the discharge flow rate adjusting valves 93A (94A) and 93C (94C) and the suction flow rate adjusting valves 95A (96A) and 95C (96C) are previously adjusted to the pre-set standard openings.

When the wafer W is moved from the position A to the position B, the processing liquid valve 35B (55B) and the suction valve 46B (66B) are opened first. Then, the movable guide pin 98A comes under the top surface of the bottom plate 2. The opening of the discharge flow rate adjusting valve 93A (94A) is increased, and the opening of the suction flow rate adjusting valve 95B (96B) is increased from the pre-set standard opening. Accordingly, a flow of the processing liquid heading from the region AA to the region AB is produced in a space between the bottom plate 2 (top plate 3) and the wafer W. The wafer W then moves afloat on the flow from the position A to the position B. When the wafer W reaches the position B and the edge face of the wafer W abuts on the two stationary guide pins 97 on the region AB side, the movable guide pin 98B is brought into a state where it protrudes from the top surface of the bottom plate 2, so that the movement of the wafer W in the horizontal direction is limited by the two stationary guide pins 97 on the region AB side and one movable guide pin 98B. Subsequently, the opening of the suction flow rate adjusting valve 95B (96B) is returned to the pre-set standard opening, and the processing liquid valve 35A (55A) and the suction valves 46A (66A) are closed. It should be noted that after the processing liquid valve 35B (55B) is opened, the discharge flow rate adjusting valve 93B (94B) is maintained at the pre-set standard opening.

When the wafer W is moved from the position B to the position A, the processing liquid valve 35A (55A) and the suction valve 46A (66A) are opened first. Then, the movable guide pin 98B comes under the top surface of the bottom plate 2. The opening of the discharge flow rate adjusting valve 93B (94B) is increased, and the opening of the suction flow rate adjusting valve 95A (96A) is increased from the pre-set standard opening. Accordingly, a flow of the processing liquid heading from the region AB to the region AA is produced in a space between the bottom plate 2 (top plate 3) and the wafer W. The wafer W thus moves afloat on the flow from the position B to the position A. When the wafer W reaches the position A and the edge face of the wafer W abuts on the two stationary guide pins 97 on the region AA side, the movable guide pin 98A is brought into a state where it protrudes from the top surface of the bottom plate 2, so that the movement of the wafer W in the horizontal direction is limited by the two stationary guide pins 97 on the region AA side and one movable guide pin 98A. Subsequently, the opening of the suction flow rate adjusting valve 95A (96A) is returned to the pre-set standard opening, and the processing liquid valve 35B (55B) and the suction valves 46B (66B) are closed.

By moving the wafer W back and forth between the position A and the position B on the bottom plate 2 (top plate 3) in this manner, it is possible to supply the processing liquid to the front surface (and the back surface) of the wafer W more uniformly. The uniformity of the processing can be therefore enhanced further.

Figure 13:
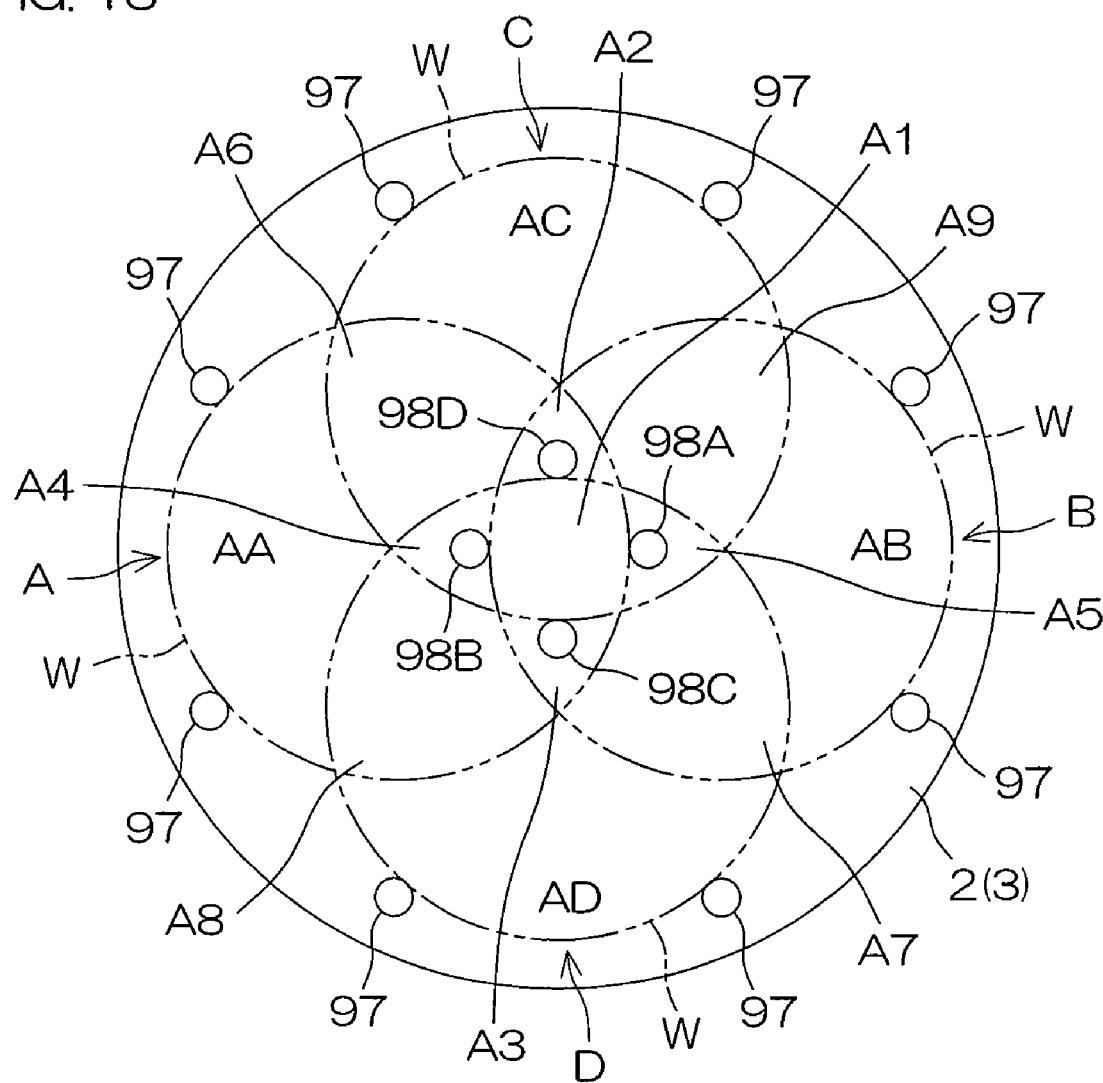
FIG. 13 is a view (a plan view of the top surface of the bottom plate (the bottom surface of the top plate)) used to describe a modification in which the wafer is allowed to move among four positions.

The position of the wafer W on the bottom plate 2 (top plate 3) is not limited to the two positions: the position A and the position B, and the wafer W may be moved among three or more than three positions. For example, as is shown in FIG. 13, the wafer W may be moved on the bottom plate 2 (top plate 3) among four positions A, B, C, and D set equiangularly at 90° about the center of the bottom plate 2.

In this case, a region AA opposing the wafer W disposed at the position A, a region AB opposing the wafer W disposed at the position B, a region AC opposing the wafer W disposed at the position C, a region AD opposing the wafer W disposed at the position D, a region A1 that is an overlapping portion of the region AA, the region AB, the region AC, and the region AD (=AA∩AB∩AC∩AD), a region A2 that is an overlapping portion of the region AA, the region AB, and the region AC excluding the region A1 (=AA∩AB∩AC−AA∩AB∩AC∩AD), a region A3 that is an overlapping portion of the region AA, the region AB, and the region AD excluding the region A1 (=AA∩AB∩AD−AA∩AB∩AC∩AD), a region A4 that is an overlapping portion of the region AA, the region AC, and the region AD excluding the region A1 (=AA∩AC∩AD−AA∩AB∩AC∩AD), a region A5 that is an overlapping portion of the region AB, the region AC, and the region AD excluding the region A1 (=AB∩AC∩AD−AA∩AB∩AC∩AD), a region A6 that is an overlapping portion of the region AA and the region AC excluding the region A1, the region A2, and the region A4, a region A7 that is an overlapping portion of the region AB and the region AD excluding the region A1, the region A3, and the region A5, a region A8 that is an overlapping portion of the region AA and the region AD excluding the region A1, the region A3, and the region A4, and a region A9 that is an overlapping portion of the region AB and the region AC excluding the region A1, the region A2, and the region A5, are set on the top surface of the bottom plate 2 (the bottom surface of the top plate 3). The discharge ports 16 (22) and the suction ports 17 (23) made in the bottom plate 2 (top plate 3) are divided to those present in a region that is part of the region AA excluding a portion overlapping on the region AC or the region AD, those present in a region that is part of the region AB excluding a portion overlapping on the region AC or the region AD, those present in a region that is part of the region AC excluding a portion overlapping on the region AA or the region AB, those present in a region that is part of the region AD excluding a portion overlapping on the region AA or the region AB, and those present in each of the regions A1 through A9. Supply systems of the processing liquid to the discharge ports 16 (22) present in the respective regions are formed independently from one another, and suction systems of the processing liquid through the suction ports 17 (23) present in the respective regions are formed independently from one another. This configuration makes it possible to control a flow rate of the processing liquid discharged from the discharge ports 16 (22) and a flow rate of the processing liquid sucked through the suction ports 17 (23) region by region. Hence, as with the control in the case described with reference to FIG. 11 and FIG. 12, it is possible to move the wafer W among the positions A through D freely and smoothly, for example, by forcing the wafer W to move sequentially in order of the position A, the position D, the position B, the position C, and the position A.

In this case, for example, eight stationary guide pins 97 and four movable guide pins 98A, 98B, 98C, and 98D are provided to stand on the bottom plate 2. The eight stationary guide pins 97 are paired and the respective pairs are provided on the outer edge portion of the bottom plate 2 correspondingly to the regions AA, AB, AC, and AD. The four movable guide pins 98A, 98B, 98C, and 98D are disposed at the center portion of the bottom plate 2. The four movable guide pins 98A, 98B, 98C, and 98D are provided in such a manner that they are able to travel forward and backward to be in a state where they protrude from the top surface of the bottom plate 2 and in a state where they come under the top surface of the bottom plate 2. The movable guide pin 98A is disposed at a position at which it abuts on the edge face of the wafer W when the wafer W moves to the position A. The movable guide pin 98A together with two stationary guide pins 97 limits the position of the wafer W to the position A. The movable guide pin 98B is disposed at a position at which it abuts on the edge face of the wafer W when the wafer W moves to the position B. The movable guide pin 98B together with two stationary guide pins 97 limits the position of the wafer W to the position B. The movable guide pin 98C is disposed at a position at which it abuts on the edge face of the wafer W when the wafer W moves to the position C. The movable guide pin 98C together with two stationary guide pins 97 limits the position of the wafer W to the position C. The movable guide pin 98D is disposed at a position at which it abuts on the edge face of the wafer W when the wafer W moves to the position D. The movable guide pin 98D together with two stationary guide pins 97 limits the position of the wafer W to the position D.

In the embodiments described above, the discharge ports 16 (22) are arrayed in a matrix fashion at regular intervals in the first direction and the second direction orthogonal to the first direction, and the suction ports 17 (23) are disposed around any discharge port 16 (22) at the positions of the apexes of a regular hexagon about the discharge port 16 (22). However, the positional relation between the discharge ports 16 (22) and the suction ports 17 (23) may be inversed from that in the embodiments above. More specifically, the discharge ports 16 (22) may be disposed at the positions of the apexes of a regular hexagon about any suction port 17 (23). In this case, in order to suck the processing liquid or the like discharged from the respective discharge ports 16 (22) through the suction ports 17 (23) in a reliable manner, it is preferable that the diameter of the suction ports 17 (23) is larger than the diameter of the discharge ports 16 (22).

While the embodiments of the present invention have been described in detail, it should be appreciated that these embodiments represent examples to provide clear understanding of the technical contents of the present invention, and the present invention is not limited to these examples. The sprit and the scope of the invention, therefore, are limited solely by the scope of the appended claims.

This application corresponds to and claims the benefit of priority from the Japanese Patent Application No. 2006-30171 filed with the Japanese Patent Office on Feb. 7, 2006, the Japanese Patent Application No. 2006-139268 filed with the Japanese Patent Office on May 18, 2006, and the Japanese Patent Application No. 2006-260619 filed with the Japanese Patent Office on Sep. 26, 2006, the entire contents of which are incorporated herein by reference.

What is claimed is:

1. A substrate processing apparatus that applies processing using a processing liquid to a substrate, comprising:
   a first-side plate disposed oppositely to a first surface of the substrate with a distance and provided with plural discharge ports and suction ports in a surface opposing the first surface;
   a first-side processing liquid supply mechanism that supplies a processing liquid to the discharge ports in the first-side plate;
   a first-side suction mechanism that sucks insides of the suction ports in the first-side plate;
   a second-side plate disposed oppositely to a second surface of the substrate on an opposite side of the first surface with a distance and provided with plural discharge ports and suction ports in a surface opposing the second surface;

a second-side processing liquid supply mechanism that supplies the processing liquid to the discharge ports in the second-side plate;

a second-side suction mechanism that sucks insides of the suction ports in the second-side plate; and a second-side rotation driving mechanism that is coupled to the second-side plate and rotates the second-side plate about an axis line orthogonal to the surface of the second-side plate opposing the second surface of the substrate.

2. The substrate processing apparatus according to claim 1, wherein
the first-side processing liquid supply mechanism supplies the discharge ports in the first-side plate with a chemical liquid as the processing liquid.

3. The substrate processing apparatus according to claim 2, comprising
a first-side pure water supply mechanism that supplies pure water to the discharge ports in the first-side plate.

4. The substrate processing apparatus according to claim 3, wherein
the discharge ports to which the pure water is supplied by the first-side pure water supply mechanism are common with the discharge ports to which the processing liquid is supplied by the first-side processing liquid supply mechanism.

5. The substrate processing apparatus according to claim 3, wherein
the discharge ports to which the pure water is supplied by the first-side pure water supply mechanism are different from the discharge ports to which the processing liquid is supplied by the first-side processing liquid supply mechanism.

6. The substrate processing apparatus according to claim 3, comprising
a first-side drying accelerator fluid supply mechanism that supplies the discharge ports in the first-side plate with a drying accelerator fluid that accelerates drying of the substrate.

7. The substrate processing apparatus according to claim 6, wherein
the discharge ports to which the drying accelerator fluid is supplied by the first-side drying accelerator fluid supply mechanism are common with the discharge ports to which the processing liquid is supplied by the first-side processing liquid supply mechanism.

8. The substrate processing apparatus according to claim 6, wherein
the discharge ports to which the drying accelerator fluid is supplied by the first-side drying accelerator fluid supply mechanism are different from the discharge ports to which the processing liquid is supplied by the first-side processing liquid supply mechanism.

9. The substrate processing apparatus according to claim 2, comprising
a first-side gas supply mechanism that supplies an inert gas to the discharge ports in the first-side plate.

10. The substrate processing apparatus according to claim 9, wherein
the discharge ports to which the inert gas is supplied by the first-side gas supply mechanism are common with the discharge ports to which the processing liquid is supplied by the first-side processing liquid supply mechanism.

11. The substrate processing apparatus according to claim 9, wherein
the discharge ports to which the inert gas is supplied by the first-side gas supply mechanism are different from the discharge ports to which the processing liquid is supplied by the first-side processing liquid supply mechanism.

12. The substrate processing apparatus according to claim 1, wherein
the first-side processing liquid supply mechanism supplies the discharge ports in the first-side plate with pure water as the processing liquid.

13. The substrate processing apparatus according to claim 12, comprising
a first-side drying accelerator fluid supply mechanism that supplies the discharge ports in the first-side plate with a drying accelerator fluid that accelerates drying of the substrate.

14. The substrate processing apparatus according to claim 13, wherein
the discharge ports to which the drying accelerator fluid is supplied by the first-side drying accelerator fluid supply mechanism are common with the discharge ports to which the processing liquid is supplied by the first-side processing liquid supply mechanism.

15. The substrate processing apparatus according to claim 13, wherein
the discharge ports to which the drying accelerator fluid is supplied by the first-side drying accelerator fluid supply mechanism are different from the discharge ports to which the processing liquid is supplied by the first-side processing liquid supply mechanism.

16. The substrate processing apparatus according to claim 1, comprising
a first-side flow rate control mechanism that controls a flow rate of the processing liquid supplied to the discharge ports by the first-side processing liquid supply mechanism.

17. The substrate processing apparatus according to claim 1, comprising
a second-side flow rate control mechanism that controls a flow rate of the processing liquid supplied to the discharge ports by the second-side processing liquid supply mechanism.

18. The substrate processing apparatus according to claim 1, wherein
the second-side plate serves also as a substrate carrier mechanism that carries the substrate to a substrate processing position opposing the first-side plate.

19. The substrate processing apparatus according to claim 1, comprising
a separation and approximation mechanism that allows the first-side plate and the second-side plate to come closer and move apart relatively to each other.

20. The substrate processing apparatus according to claim 1, comprising
a sealing mechanism that seals a space between an outer edge portion of the first-side plate and an outer edge portion of the second-side plate.

21. The substrate processing apparatus according to claim 1, wherein
the second-side plate is provided with channels connected to the discharge ports, and
connection portions of the channels to the discharge ports have tapered cross sections that widen toward the discharge ports.

22. The substrate processing apparatus according to claim 1, wherein
the second-side plate is provided with channels connected to the discharge ports, and
the substrate processing apparatus comprises discharge pressure dispersing balls provided in connection portions of the channels to the discharge ports.

23. The substrate processing apparatus according to claim 1, comprising
a first-side rotation driving mechanism that is coupled to the first-side plate and rotates the first-side plate about an axis line orthogonal to the surface of the first-side plate opposing the first surface of the substrate.

24. The substrate processing apparatus according to claim 1, wherein
the first-side plate is provided with channels connected to the discharge ports, and
connected portions of the channels to the discharge ports have tapered cross sections that widen toward the discharge ports.

25. The substrate processing apparatus according to claim 1, wherein
the first-side plate is provided with channels connected to the discharge ports, and
the substrate processing apparatus comprises discharge pressure dispersing balls provided in connection portions of the channels to the discharge ports.

26. The substrate processing apparatus according to claim 1, wherein
the substrate has on the first surface a device forming region in which devices are formed.

27. The substrate processing apparatus according to claim 1, wherein
the substrate has on the second surface opposite to the first surface a device forming region in which devices are formed.

28. The substrate processing apparatus according to claim 1, comprising
a processing liquid reusing mechanism that allows the processing liquid sucked through the suction ports in the first-side plate by the first-side suction mechanism to be reused for processing a substrate by returning the processing liquid to supply channels of the processing liquid of the first-side processing liquid supply mechanism.

29. The substrate processing apparatus according to claim 1, comprising
a substrate rotating mechanism that rotates the substrate on the first-side plate.

30. The substrate processing apparatus according to claim 1, comprising
a substrate position moving mechanism that moves a position of the substrate on the first-side plate.

31. A substrate processing apparatus that applies processing using a processing liquid to a substrate, comprising:
a first-side plate disposed oppositely to a first surface of the substrate with a distance and provided with plural discharge ports and suction ports in a surface opposing the first surface;
a first-side processing liquid supply mechanism that supplies a processing liquid to the discharge ports in the first-side plate;
a first-side suction mechanism that sucks insides of the suction ports in the first-side plate;
a second-side plate disposed oppositely to a second surface of the substrate on an opposite side of the first surface with a distance and provided with plural discharge ports and suction ports in a surface opposing the second surface;
a second-side gas supply mechanism that supplies an inert gas to the discharge ports in the second-side plate;
a second-side suction mechanism that sucks insides of the suction ports in the second-side plate; and
a second-side rotation driving mechanism that is coupled to the second-side plate and rotates the second-side plate about an axis line orthogonal to the surface of the second-side plate opposing the second surface of the substrate.

32. The substrate processing apparatus according to claim 31, wherein
the second-side plate serves also as a substrate carrier mechanism that carries the substrate to a substrate processing position opposing the first-side plate.

33. The substrate processing apparatus according to claim 31, comprising
a separation and approximation mechanism that allows the first-side plate and the second-side plate to come closer and move apart relatively to each other.

34. The substrate processing apparatus according to claim 31, comprising
a sealing mechanism that seals a space between an outer edge portion of the first-side plate and an outer edge portion of the second-side plate.

35. The substrate processing apparatus according to claim 31, wherein
the second-side plate is provided with channels connected to the discharge ports, and
connection portions of the channels to the discharge ports have tapered cross sections that widen toward the discharge ports.

36. The substrate processing apparatus according to claim 31, wherein
the second-side plate is provided with channels connected to the discharge ports, and
the substrate processing apparatus comprises discharge pressure dispersing balls provided in connection portions of the channels to the discharge ports.

37. The substrate processing apparatus according to claim 31, comprising
a first-side rotation driving mechanism that is coupled to the first-side plate and rotates the first-side plate about an axis line orthogonal to the surface of the first-side plate opposing the first surface of the substrate.

38. The substrate processing apparatus according to claim 31, wherein
the substrate has on the first surface a device forming region in which devices are formed.

39. The substrate processing apparatus according to claim 31, wherein
the substrate has on the second surface opposite to the first surface a device forming region in which devices are formed.

40. The substrate processing apparatus according to claim 31, comprising
a processing liquid reusing mechanism that allows the processing liquid sucked through the suction ports in the first-side plate by the first-side suction mechanism to be reused for processing a substrate by returning the processing liquid to supply channels of the processing liquid of the first-side processing liquid supply mechanism.

* * * * *